(12) United States Patent
Pawlak

(10) Patent No.: US 10,134,901 B1
(45) Date of Patent: Nov. 20, 2018

(54) METHODS OF FORMING A BULK FIELD EFFECT TRANSISTOR (FET) WITH SUB-SOURCE/DRAIN ISOLATION LAYERS AND THE RESULTING STRUCTURES

(71) Applicant: GLOBALFOUNDRIES INC., Grand Cayman (KY)

(72) Inventor: Bartlomiej J. Pawlak, Leuven (BE)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 15/632,922

(22) Filed: Jun. 26, 2017

(51) Int. Cl.
| | |
|---|---|
| H01L 29/78 | (2006.01) |
| H01L 29/06 | (2006.01) |
| H01L 29/165 | (2006.01) |
| H01L 29/66 | (2006.01) |
| H01L 29/423 | (2006.01) |

(52) U.S. Cl.
CPC ........ H01L 29/785 (2013.01); H01L 29/0653 (2013.01); H01L 29/165 (2013.01); H01L 29/42392 (2013.01); H01L 29/66545 (2013.01); H01L 29/66795 (2013.01)

(58) Field of Classification Search
CPC ............. H01L 29/41791; H01L 29/785; H01L 2029/7858; H01L 29/0653
See application file for complete search history.

(56) References Cited

U.S. PATENT DOCUMENTS

| | | | |
|---|---|---|---|
| 8,389,367 B2 | 3/2013 | Zhou et al. | |
| 8,697,536 B1 | 4/2014 | Cheng et al. | |
| 8,778,744 B2 | 7/2014 | Zhou et al. | |
| 8,809,178 B2 | 8/2014 | Liu et al. | |
| 8,956,942 B2 | 2/2015 | Loubet et al. | |
| 9,425,315 B2 | 8/2016 | Jacob et al. | |
| 9,741,810 B2 * | 8/2017 | Ching | ............... H01L 29/42392 |
| 2015/0001591 A1 | 1/2015 | Akarvardar et al. | |

(Continued)

FOREIGN PATENT DOCUMENTS

WO    2014204477 A1    12/2014

OTHER PUBLICATIONS

Tutorial IEDM 2015:Advance Device Concepts for 7nm Node and Beyond, Dec. 5, 2015, pp. 1-51.

*Primary Examiner* — Tucker J Wright
(74) *Attorney, Agent, or Firm* — Gibb & Riley, LLC; Yuanmin Cai

(57) ABSTRACT

Disclosed are structures (e.g., a fin-type field effect transistor (FINFET) and a nanowire-type FET (NWFET)) and methods of forming the structures. In the methods, a fin is formed. For a FINFET, the fin includes a first semiconductor material. For an NWFET, the fin includes alternating layers of first and second semiconductor materials. A gate is formed on the fin. Recesses are formed in the fin adjacent to the gate and extend to (or into) a semiconductor layer, below, made of the second semiconductor material. An oxidation process forms oxide layers on exposed semiconductor surfaces in the recesses including a first oxide material on the first semiconductor material and a second oxide material on the second semiconductor material. The first oxide material is then selectively removed and source/drain regions are formed by lateral epitaxial deposition in the recesses. The remaining second oxide material minimizes sub-channel region source-to-drain leakage.

18 Claims, 29 Drawing Sheets

(56) References Cited

U.S. PATENT DOCUMENTS

2015/0145002 A1* 5/2015 Lee .................... H01L 27/0922
 257/192
2017/0104062 A1 4/2017 Bi et al.

\* cited by examiner

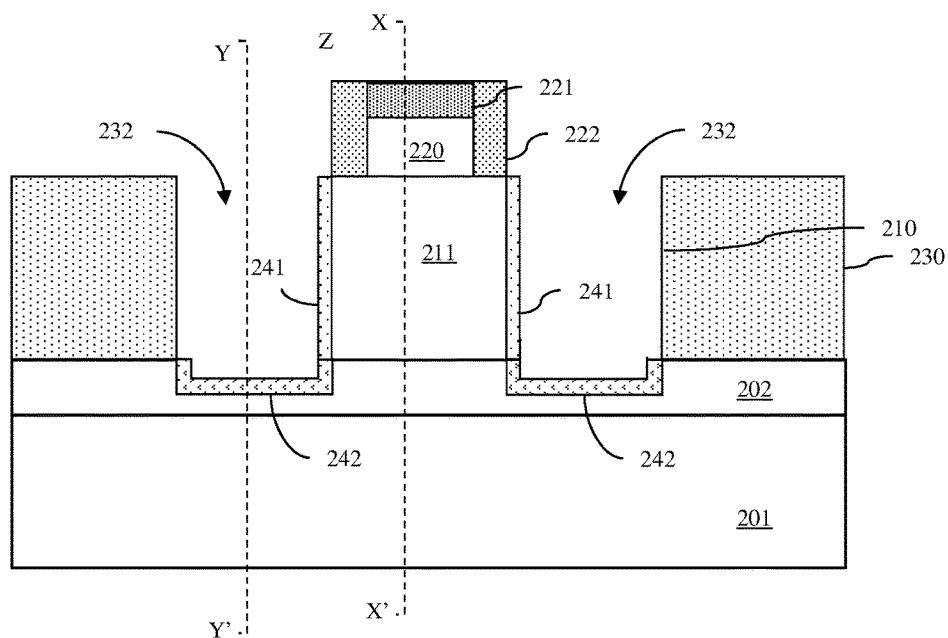
FIG. 9A
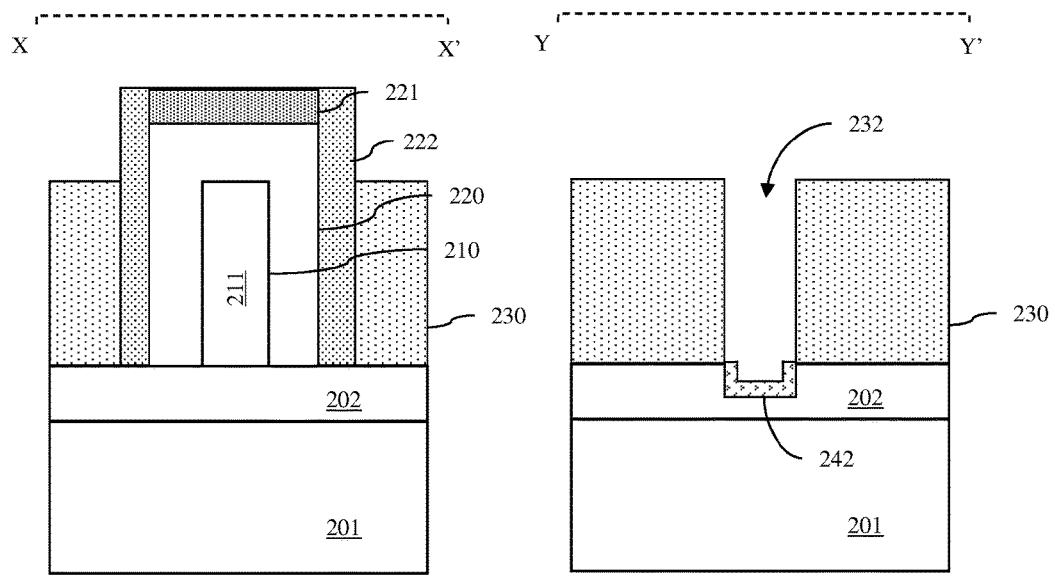
FIG. 9B
FIG. 9C

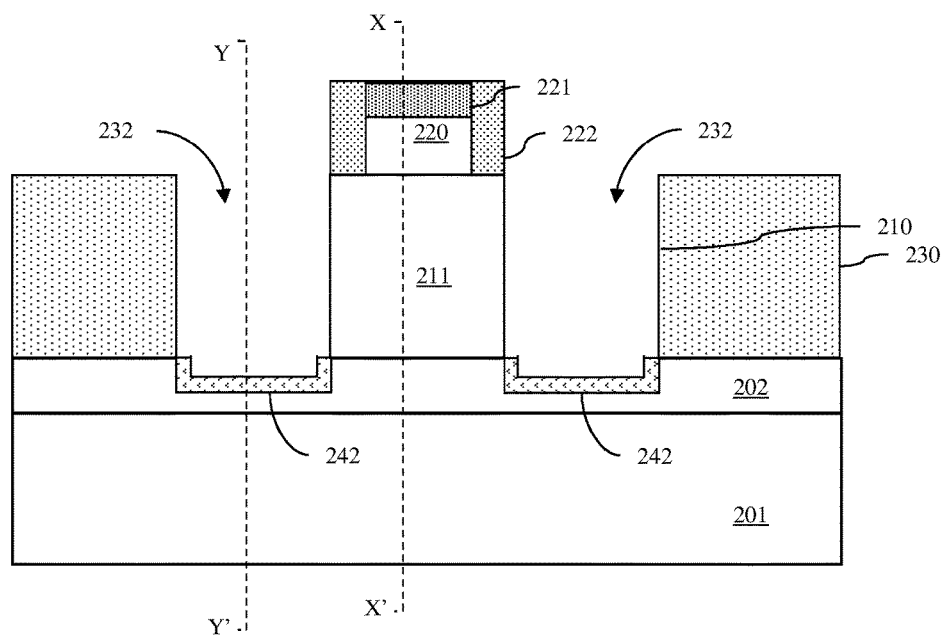
FIG. 10A
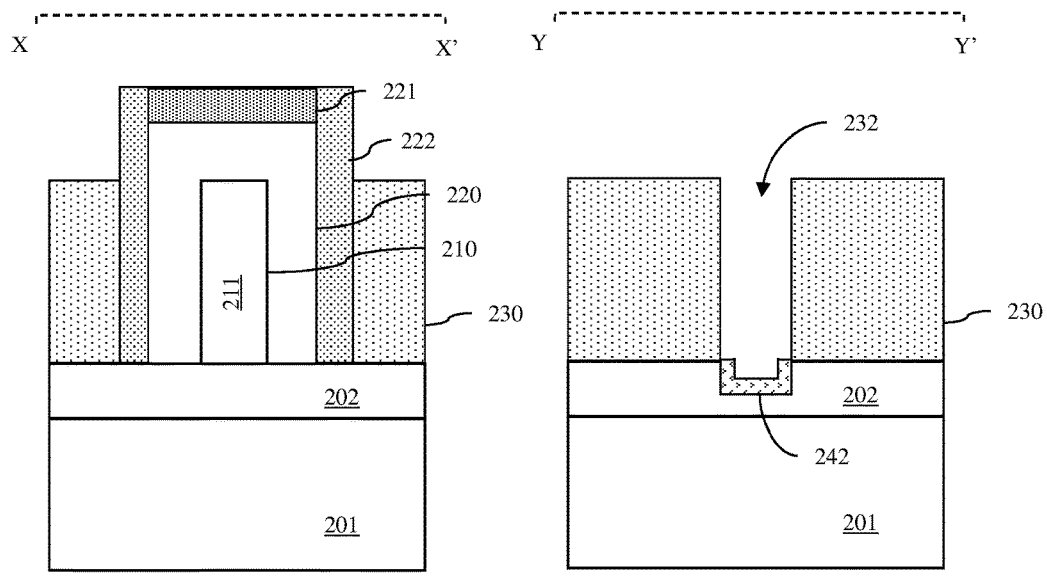
FIG. 10B
FIG. 10C

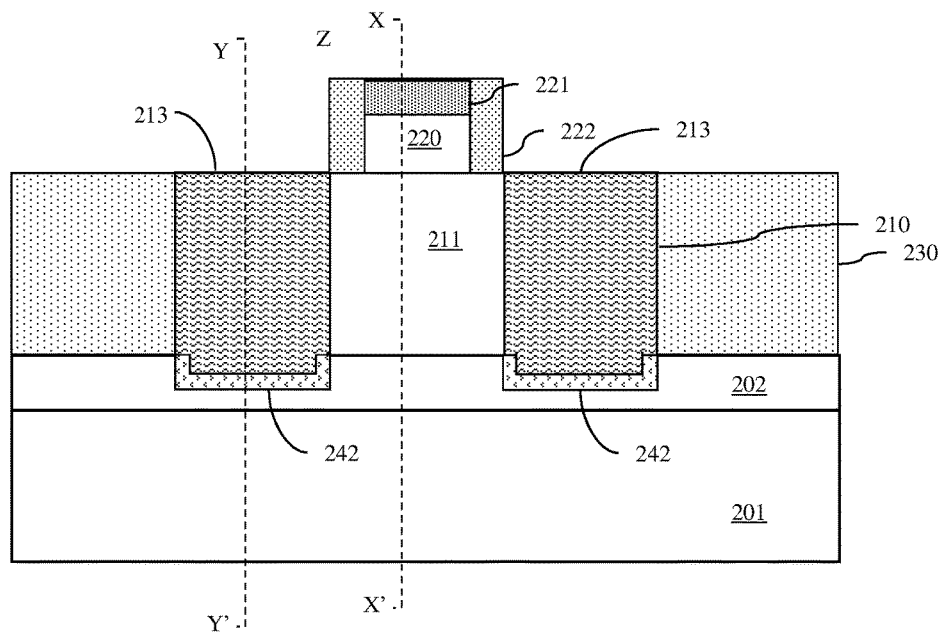
FIG. 11A
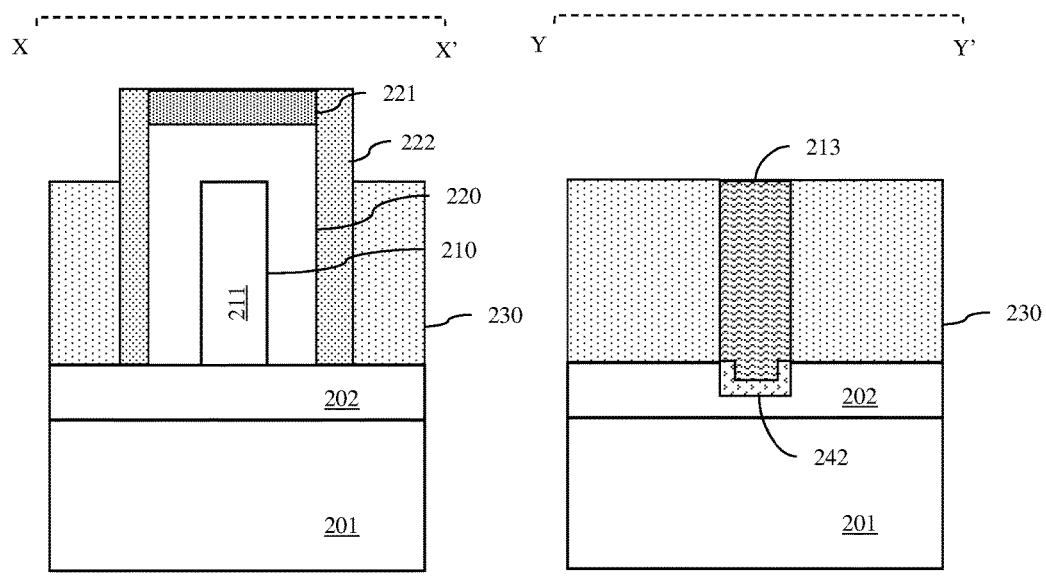
FIG. 11B
FIG. 11C

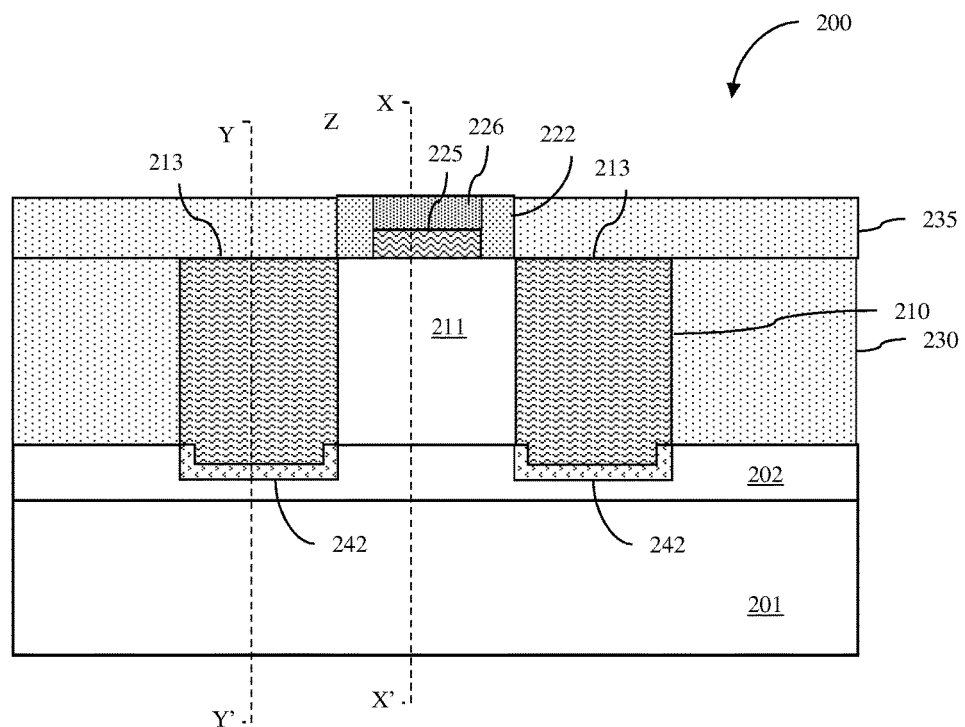
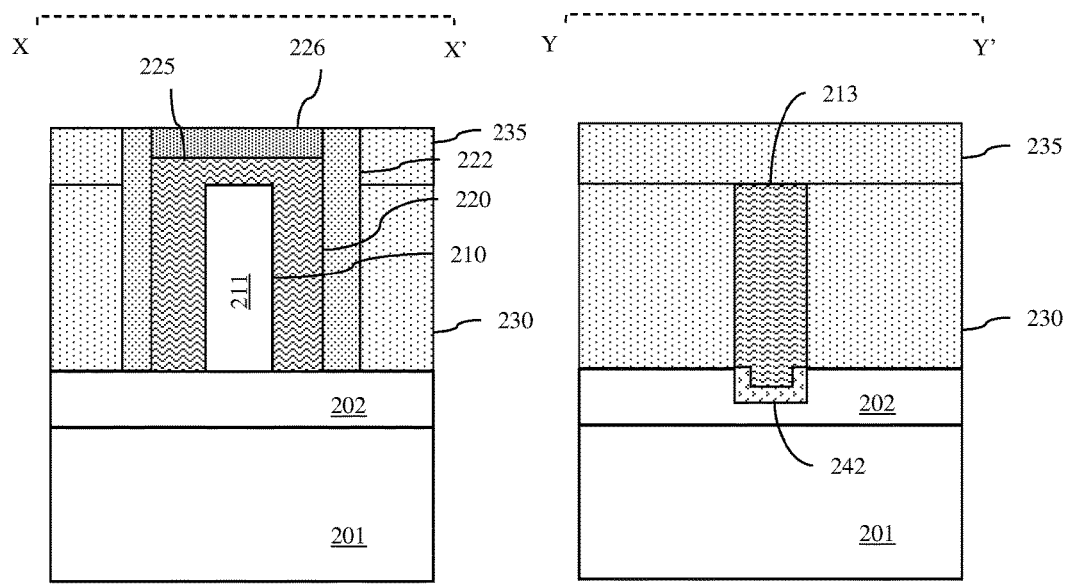 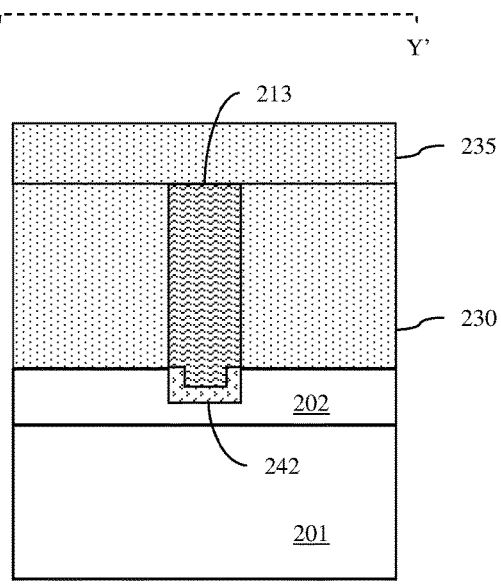
FIG. 12B  FIG. 12C

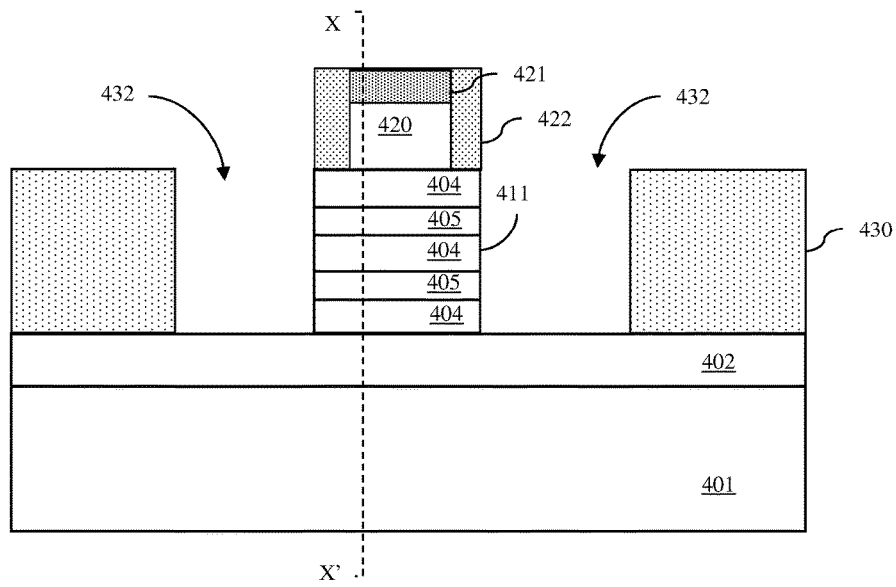
FIG. 18A
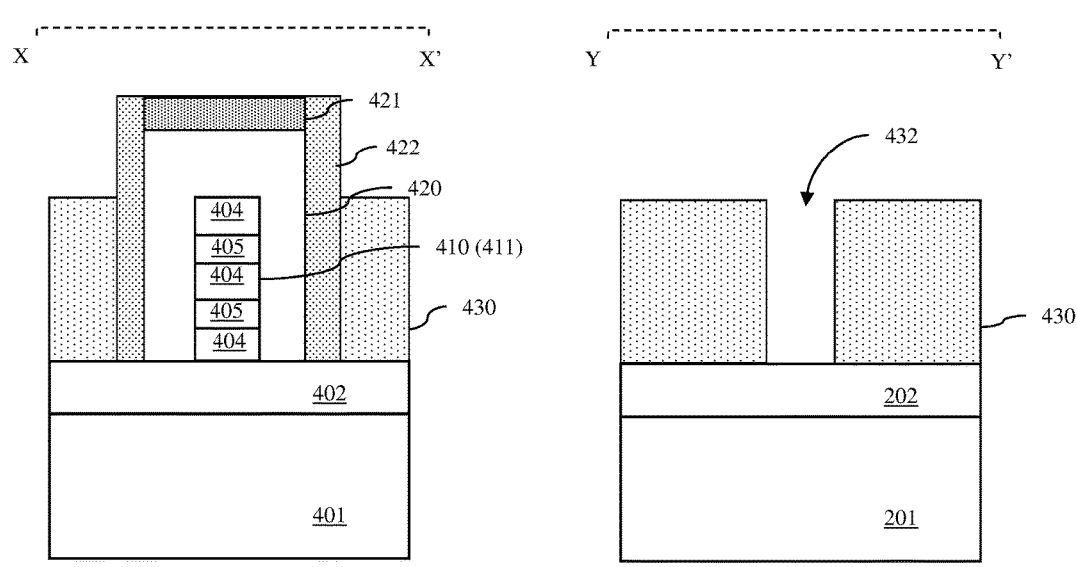
FIG. 18B
FIG. 18C

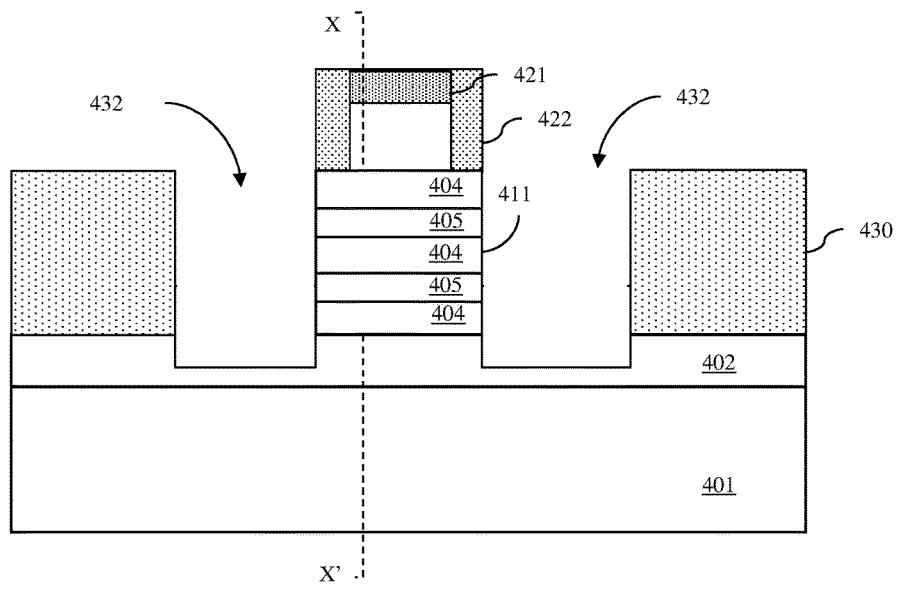
FIG. 19A
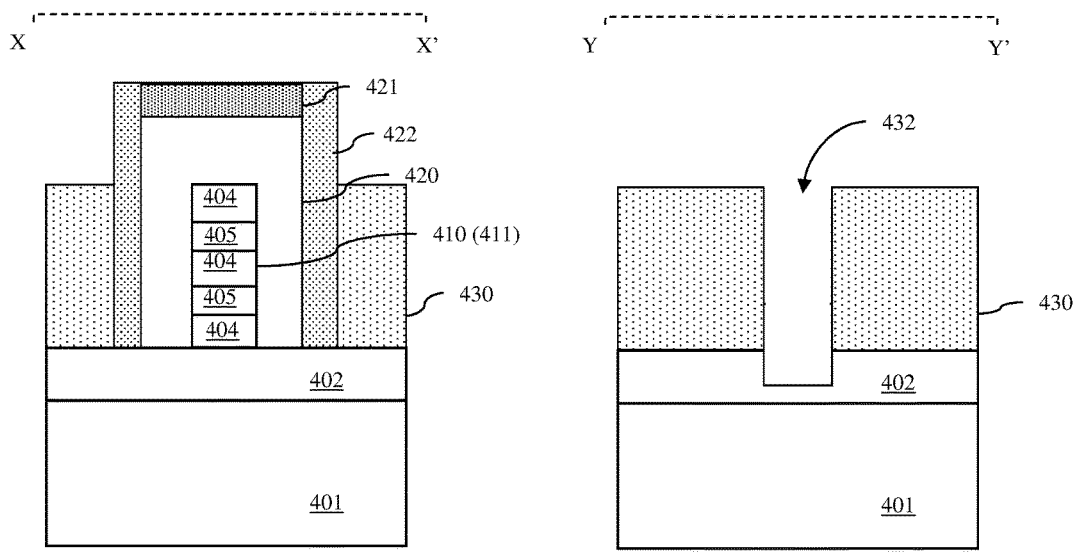
FIG. 19B
FIG. 19C

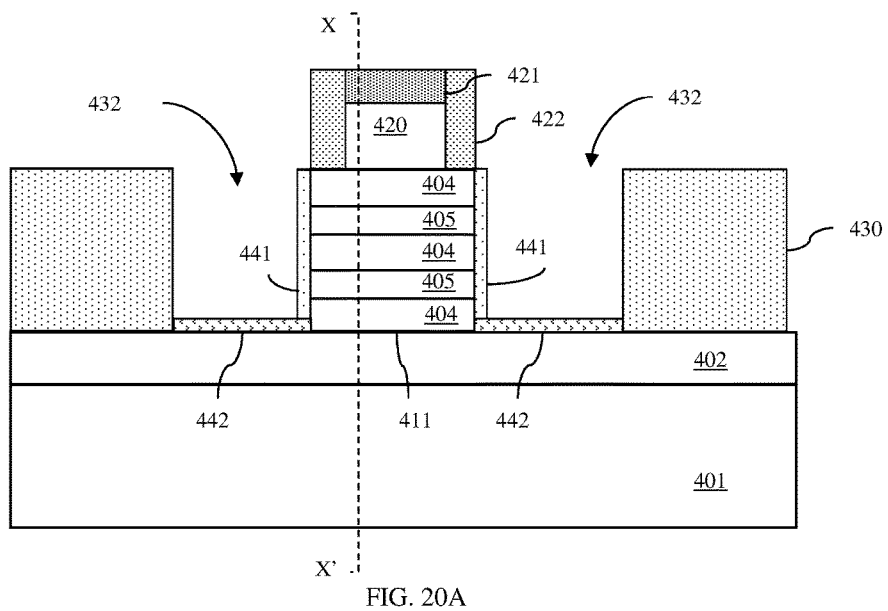
FIG. 20A
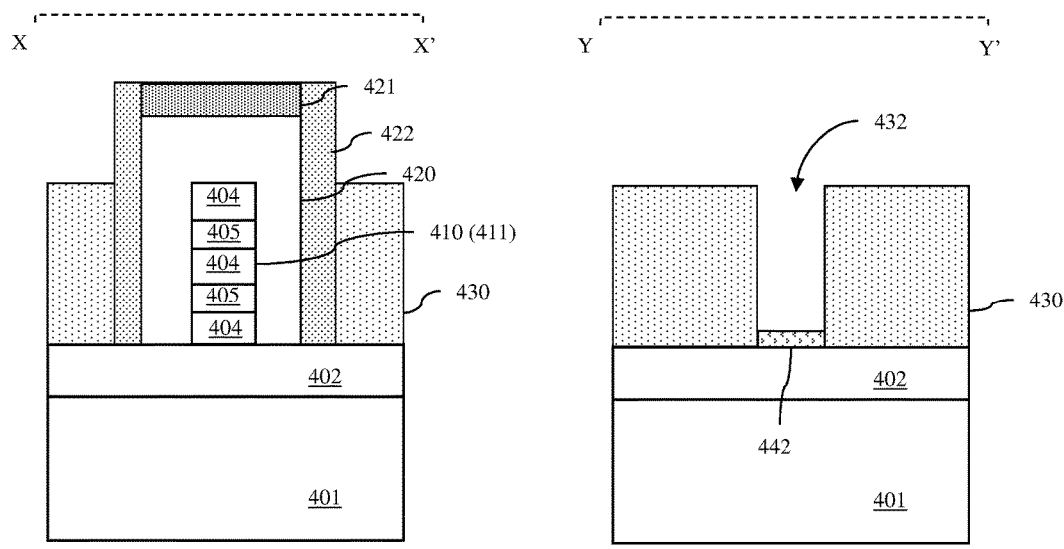
FIG. 20B
FIG. 20C

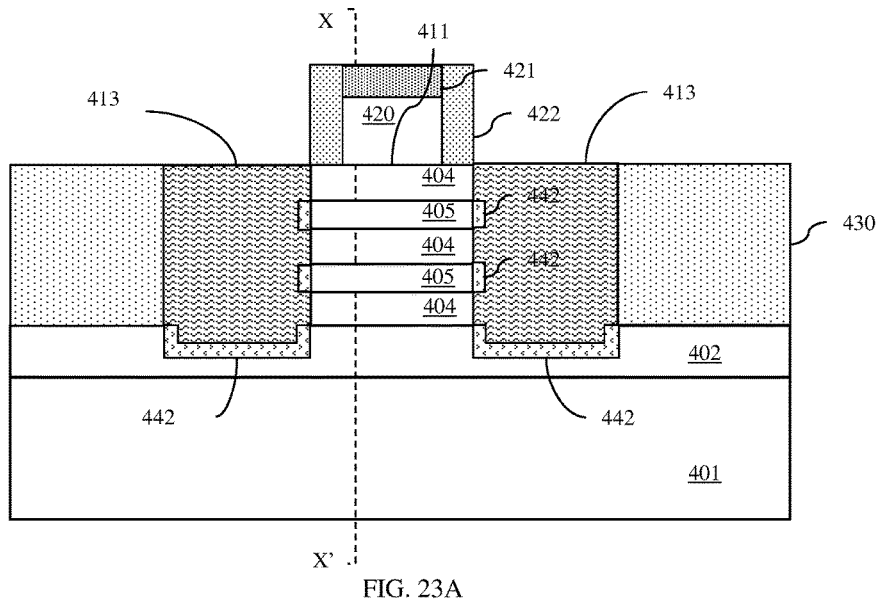
FIG. 23A
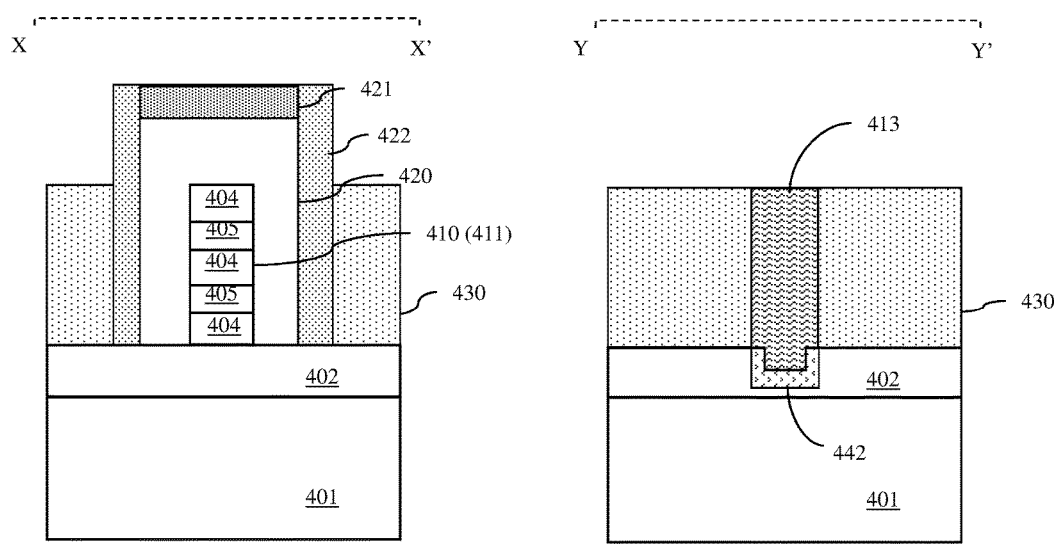
FIG. 23B
FIG. 23C

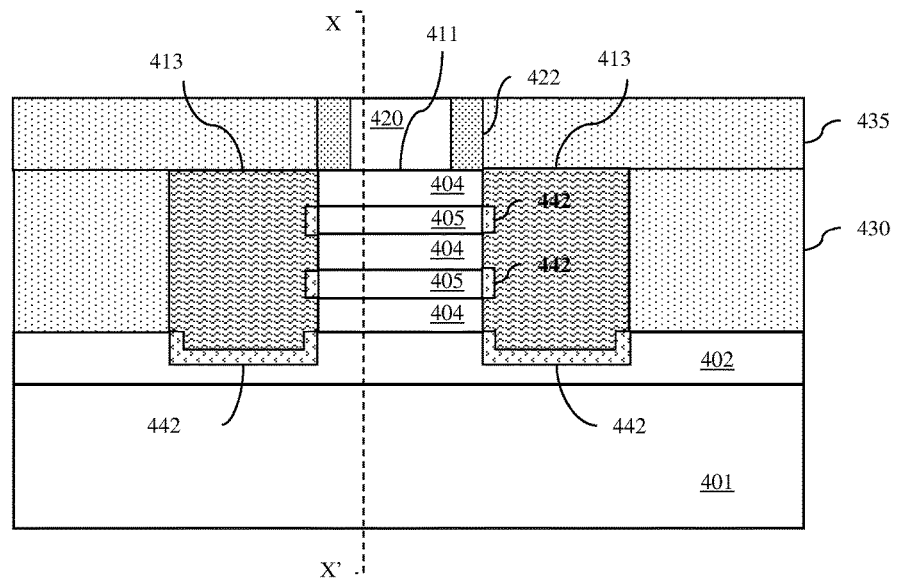
FIG. 24A
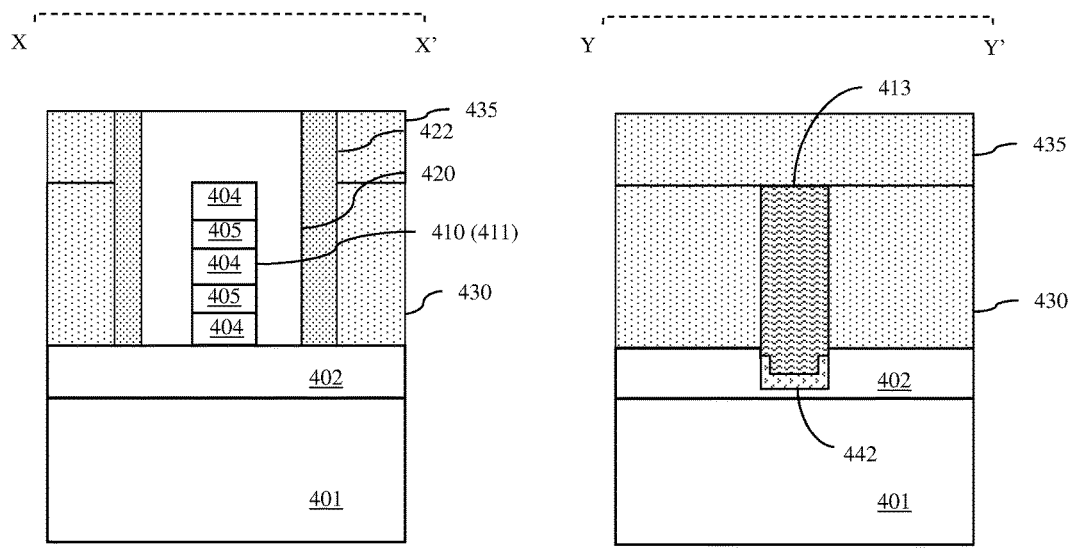
FIG. 24B
FIG. 24C

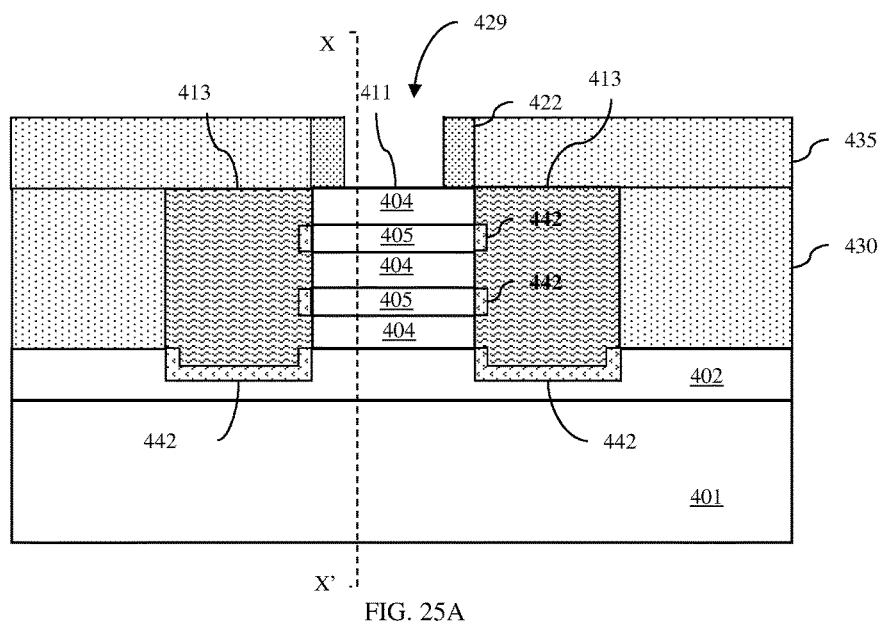
FIG. 25A
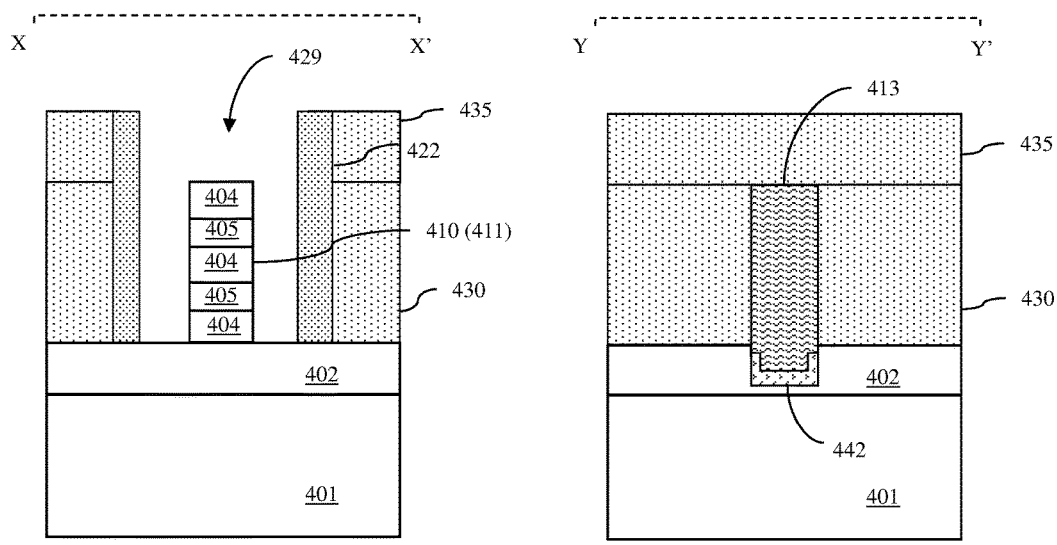
FIG. 25B
FIG. 25C

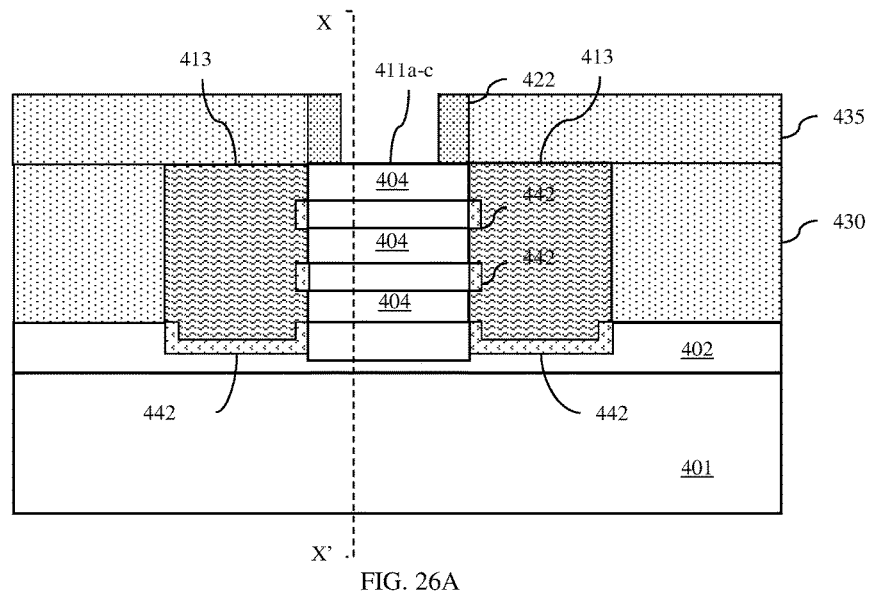
FIG. 26A
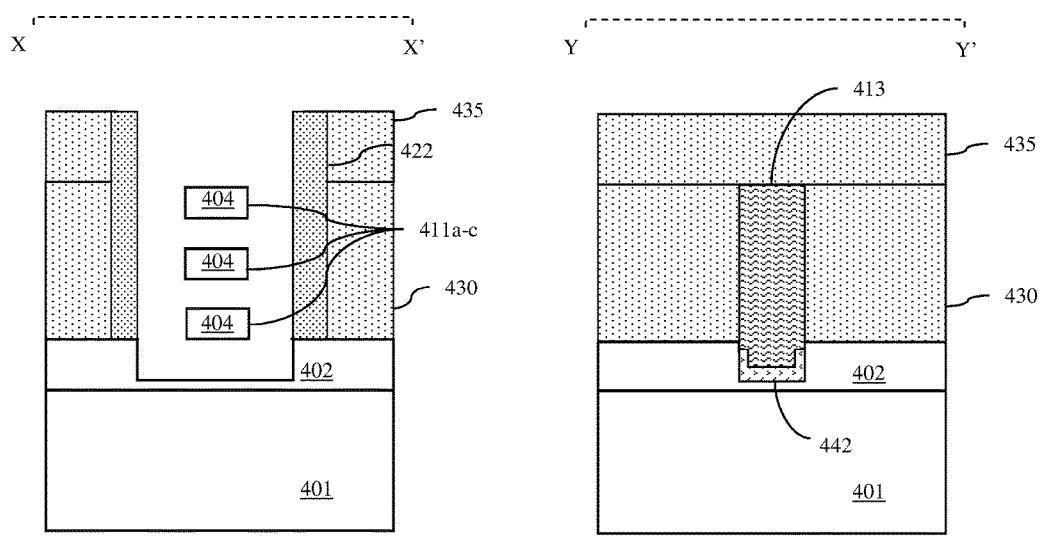
FIG. 26B
FIG. 26C

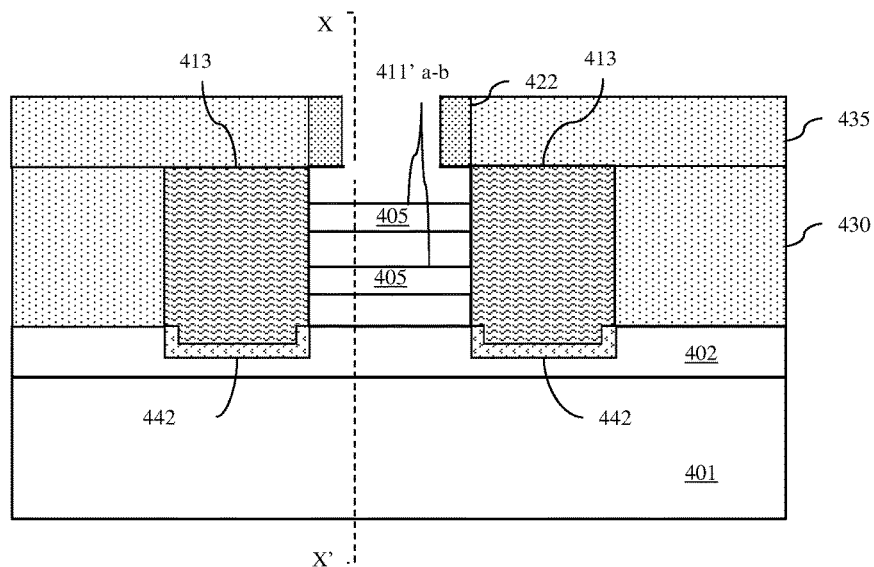
FIG. 27A
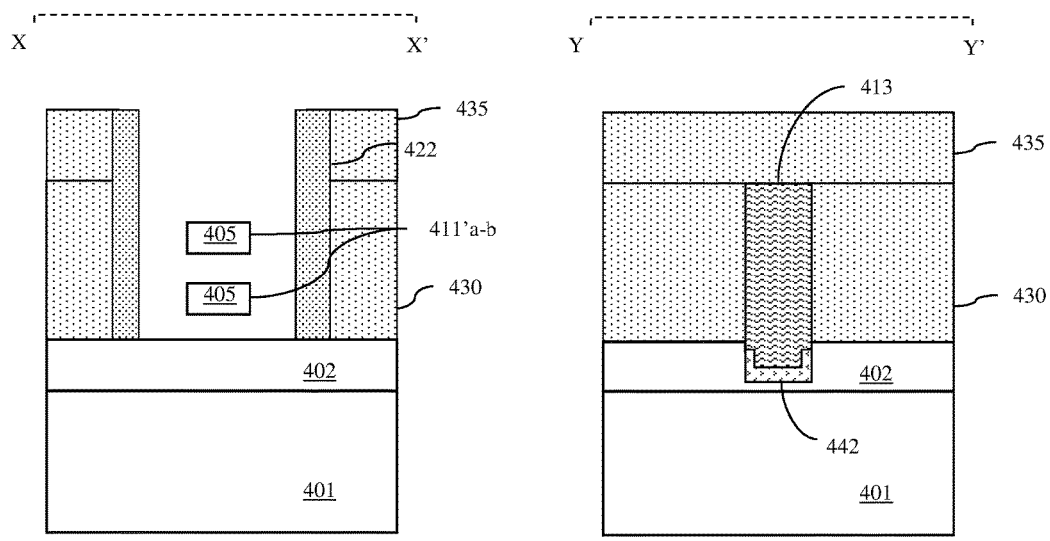
FIG. 27B
FIG. 27C

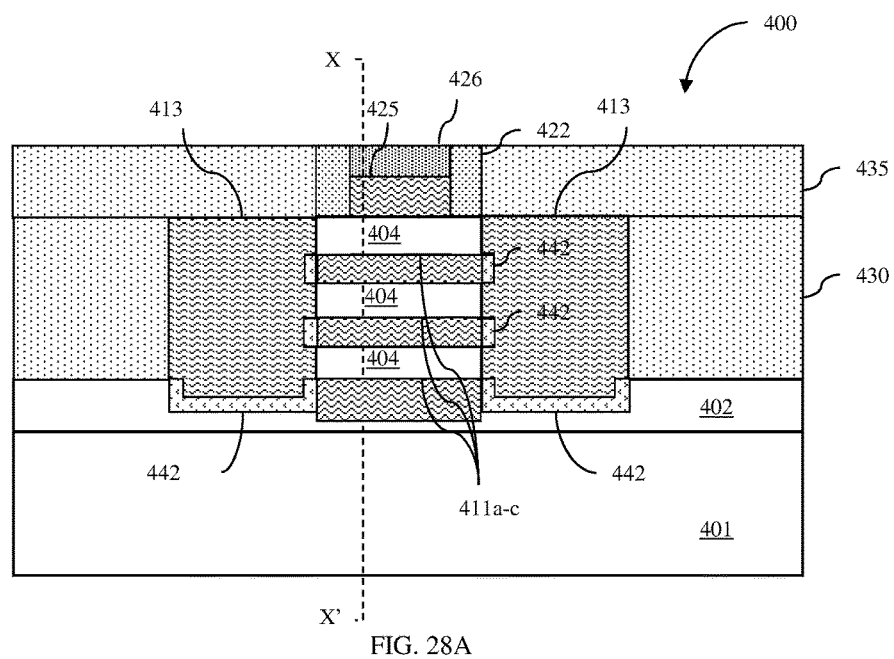
FIG. 28A
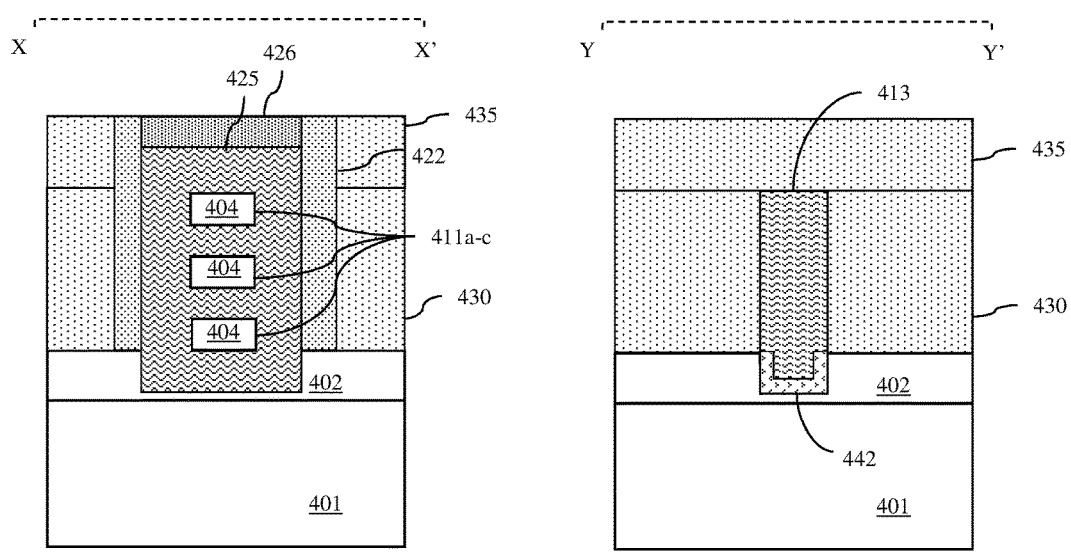
FIG. 28B
FIG. 28C

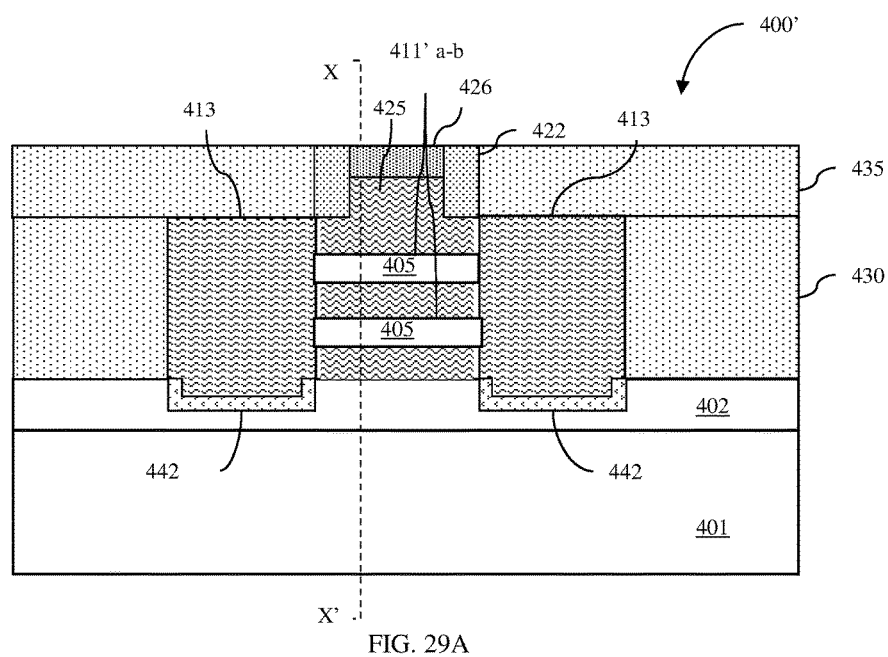
FIG. 29A
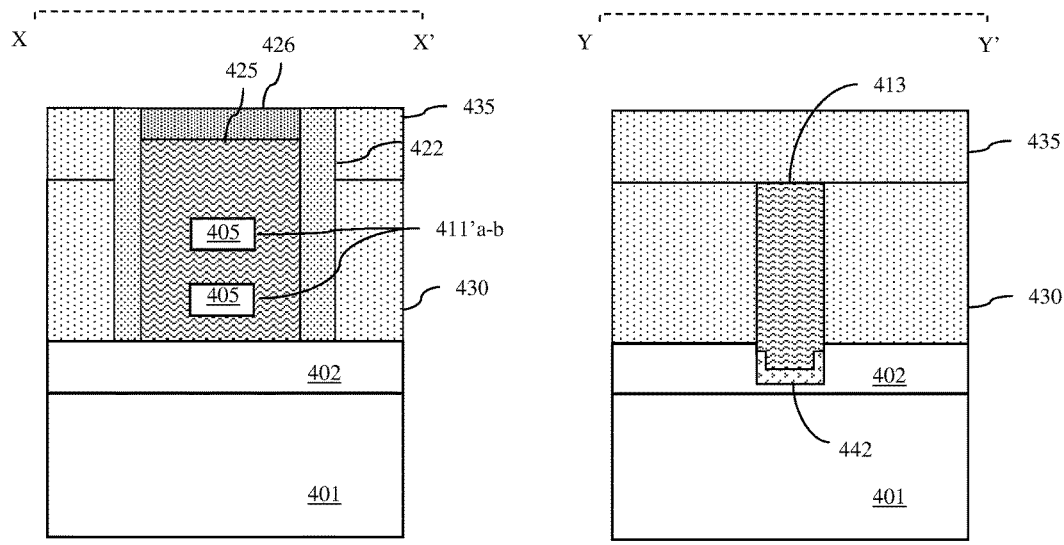
FIG. 29B
FIG. 29C

METHODS OF FORMING A BULK FIELD EFFECT TRANSISTOR (FET) WITH SUB-SOURCE/DRAIN ISOLATION LAYERS AND THE RESULTING STRUCTURES

BACKGROUND

Field of the Invention

The present invention relates to bulk non-planar field effect transistors (FETs), such as bulk fin-type FETs or bulk stacked nanowire-type FETs, and methods of forming such FETs to minimize through-substrate source-to-drain leakage.

Description of Related Art

Integrated circuit (IC) design decisions are often driven by device scalability, device density, manufacturing efficiency and costs. For example, size scaling of planar field effect transistors (FETs) resulted in the development of planar FETs with relatively short channel lengths and, consequently, the smaller channel lengths resulted in a corresponding increase in short channel effects.

In response, fin-type FETs (FINFETs) were developed. A FINFET is a non-planar FET that incorporates a semiconductor fin (i.e., a relatively tall and thin, elongated, rectangular-shaped, semiconductor body) and, within the semiconductor fin, a channel region positioned laterally between source/drain regions. A gate structure is positioned adjacent to the top surface and opposing sidewalls of the semiconductor fin at the channel region. Such a FINFET exhibits two-dimensional field effects as compared to the single-dimensional field effects exhibited by a planar FET and, thus, exhibits improved gate control over the channel. It should be noted that, because the semiconductor fin is so thin, any field effects exhibited at the top surface are insignificant (i.e., negligible).

Recently, to improve drive current and allow for further device size scaling, nanowire-type FETs (NWFETs), including both horizontal NWFETs and vertical NWFETs, have been developed. For example, a horizontal NWFET, like a FINFET, is a non-planar FET that is formed using a semiconductor fin above a substrate. However, in this case, a portion of the semiconductor fin, which is positioned laterally between the source/drain regions, is processed to form one or more nanowires, which are oriented horizontally (e.g., parallel to the top surface of the substrate and which extends between the source/drain regions. In the case of multiple nanowires, they can be physically separated from each other and stacked one above the other. The nanowire(s) function as a channel region(s) and is/are physically separated from the semiconductor material below. A gate structure is formed so that it wraps around the nanowire(s)/channel region(s). Such a NWFET exhibits multi-dimensional field effects as compared to the two dimensional field effects exhibited by FINFET and, thus, exhibits improved gate control over the channel region(s).

The above-described FINFETs and NWFETs can be formed as semiconductor-on-insulator structures. Alternatively, such FETs can be formed as bulk structures. In the case of bulk structures, ground plane doping in the form of a well region is used in the bulk semiconductor substrate below the device to prevent through-substrate source-to-drain leakage, which can negatively impact device on-off characteristics. Specifically, doped well regions in a bulk semiconductor substrate below the device to prevent direct current flow from the source region to the drain region by creating diode junctions between the source region and ground plane and between the drain region and the ground plane. Unfortunately, as device sizes continue to be scaled, ground plane doping in the bulk semiconductor substrate may not be sufficient for preventing such through-substrate source-to-drain leakage in FINFETs or in NWFETs.

SUMMARY

In view of the foregoing, disclosed herein disclosed herein are methods of forming a semiconductor structure that includes a non-planar field effect transistor (FET), such as fin-type FET (FINFET) or nanowire FET (NWFET). In the methods, a semiconductor fin can be formed. For a FINFET, the semiconductor fin can be a first semiconductor material. For an NWFET, the semiconductor fin can include alternating layers of a first semiconductor material and a second semiconductor material. A gate structure can be formed on the semiconductor fin. Then, recesses can be formed in the semiconductor fin on either side of the gate structure and can extend vertically to (or into) a semiconductor layer, which is below the fin and made of the second semiconductor material. An oxidation process can then be performed to form oxide layers on exposed semiconductor surfaces. Oxide layers on the first semiconductor material will be a first oxide material and those on the second semiconductor material will be a second oxide material. The first oxide material can be selectively removed and source/drain regions can be formed by lateral epitaxial deposition in the recesses. Also disclose herein are embodiments of a semiconductor structure that includes a non-planar FET structure (e.g., a FINFET or NWFET) form according to the above-describe method so as to have local isolation layers (i.e., the remaining oxide layers), which are below the source/drain regions and which minimize and preferably prevent through-substrate and, particularly, sub-channel region source-to-drain leakage (i.e., source-to-drain leakage below the channel region).

More particularly, disclosed herein is a method of forming a semiconductor structure that includes a fin-type FET (FINFET). In the method, a semiconductor fin, which is made of a first semiconductor material (e.g., silicon), can be formed on semiconductor layer, which is made of a second semiconductor material (e.g., silicon germanium) that is different from the first semiconductor material and which is above a bulk semiconductor substrate. The semiconductor fin can have a first portion that is positioned laterally between second portions. A sacrificial gate structure can be formed adjacent to the first portion of the semiconductor fin such that the second portions extend laterally beyond the gate structure. A dielectric layer can subsequently be formed on the semiconductor layer such that it is positioned laterally adjacent to sidewalls of the semiconductor fin and, particularly, immediately adjacent to the exposed sidewalls of the second portions of the semiconductor fin. Then, recesses can be formed through the second portions to (or into) the semiconductor layer below.

After the recesses are formed, an oxidation process can be performed in order to form oxide layers on exposed semiconductor surfaces within the recesses (i.e., on exposed semiconductor surfaces of the semiconductor layer at the bottoms of the recesses and exposed semiconductor surfaces of the semiconductor fin on the inner sides of the recesses closest to the gate structure). Since the semiconductor fin is made of the first semiconductor material and the semiconductor layer is made of the second semiconductor material, the oxide material on these components will vary. Specifically, the oxidation process will result in a first oxide material (e.g., silicon dioxide) being formed on the first semiconductor material and a second oxide material (e.g., silicon germanium oxide) that is different from the first oxide material being formed on the second semiconductor material. Next, the first oxide material can be selectively removed, leaving oxide layers, which are made of the second oxide material and which are in the bottoms of the recesses, intact. Then, source/drain regions can be formed in the recesses (e.g., by lateral epitaxial deposition on the exposed vertical surfaces of the semiconductor fin within the recesses). The second oxide material, which remains intact at the bottoms of the recesses, will electrically isolate and physically separate the source/drain regions from the semiconductor layer below.

Additional processing can be performed to complete the FINFET structure. This additional processing can include, but is not limited to, removing the sacrificial gate structure and replacing it with a replacement metal gate.

Also disclosed herein is a method of forming a semiconductor structure that includes a nanowire FET (NWFET). In the method, a multi-layer semiconductor fin can be formed on semiconductor layer above a bulk semiconductor substrate. The bulk semiconductor substrate can be made of a first semiconductor material, the semiconductor layer can be a second semiconductor material that is different from the first semiconductor material and the multi-layer semiconductor fin can include alternating layers of the first semiconductor material and the second semiconductor material. The multi-layer semiconductor fin can have a first portion that is positioned laterally between second portions. A sacrificial gate structure can then be formed adjacent to the first portion of the semiconductor fin such that the second portions extend laterally beyond the gate structure. A dielectric layer can subsequently be formed on the semiconductor layer such that it is positioned laterally adjacent to sidewalls of the semiconductor fin and, particularly, immediately adjacent to the exposed sidewalls of the second portions of the semiconductor fin. Then, recesses can be formed through the second portions to (or into) the semiconductor layer below.

After the recesses are formed, an oxidation process can be performed in order to form oxide layers on exposed semiconductor surfaces within the recesses (i.e., on exposed semiconductor surfaces of the semiconductor layer at the bottoms of the recesses and exposed semiconductor surfaces of the semiconductor fin on the inner sides of the recesses closest to the gate structure). Since the semiconductor fin is made of alternating layers of the first and second semiconductor materials and the semiconductor layer is made of the second semiconductor material, the oxide material on these components will vary. Specifically, the oxidation process will result in a first oxide material (e.g., silicon dioxide) being formed on the first semiconductor material of the alternating layers in the semiconductor fin and a second oxide material (e.g., silicon germanium oxide) that is different from the first oxide material being formed on the second semiconductor material of the alternating layers of the semiconductor fin and of the semiconductor layer. Next, the first oxide material can be selectively removed, leaving oxide layers, which are made of the second oxide material and which are in the bottoms of the recesses and on the vertical surfaces of every other layer in the semiconductor fin, intact. Subsequently, source/drain regions can be formed in the recesses (e.g., by lateral epitaxial deposition on any exposed vertical surfaces of the semiconductor fin within the recesses). The second oxide material, which remains intact at the bottoms of the recesses, will electrically isolate and physically separate the source/drain regions from the semiconductor layer below.

Additional processing can be performed to complete the NWFET structure. This additional processing can include, but is not limited to, selectively removing the sacrificial gate structure to expose the first portion of the semiconductor fin; selectively removing each exposed layer of the second semiconductor material from the first portion such that at least one nanowire of the first semiconductor material remains; and forming replacement gate structure wrapping around the at least one nanowire.

Also disclosed herein are semiconductor structures formed according to the above-described methods. Each semiconductor structure can include a bulk semiconductor substrate, a semiconductor layer on the bulk semiconductor substrate and a non-planar field effect transistor (FET) on the semiconductor layer. The non-planar FET can be, for example, a fin-type FET (FINFET) or a nanowire FET (NWFET). In either case, the FET can include source/drain regions, at least one channel region positioned laterally between the source/drain regions and a gate structure adjacent to the channel region(s). The channel region (or regions) can be a first semiconductor material (e.g., silicon) and the semiconductor layer can be a second semiconductor material that is different from the first semiconductor material (e.g., silicon germanium). Additionally, each semiconductor structure can include layers of oxide material that electrically isolate and physically separate the source/drain regions from the semiconductor layer below. Thus, these layers of oxide material function as local isolation layers that minimize and preferably prevent through-substrate and, particularly, sub-channel region source-to-drain leakage (i.e., source-to-drain leakage below the channel region).

BRIEF DESCRIPTION OF THE SEVERAL VIEWS OF THE DRAWINGS

The present invention will be better understood from the following detailed description with reference to the drawings, which are not necessarily drawn to scale and in which:

FIGS. 9A-9C are different cross-section diagrams illustrating an alternative partially completed structure formed at process 314 of the flow diagram of FIG. 1 using the partially completed structure shown in FIGS. 7A-7C;

FIGS. 10A-10C are different cross-section diagrams illustrating a partially completed structure formed according to the flow diagram of FIG. 1;

FIGS. 11A-11C are different cross-section diagrams illustrating a partially completed structure formed according to the flow diagram of FIG. 1;

FIGS. 12A-12C are different cross-section diagrams illustrating a semiconductor structure that is formed according to the method of FIG. 1 and that includes a FINFET;

FIGS. 17A-7B are different cross-section diagrams illustrating a partially completed structure formed according to the flow diagram of FIG. 13;

FIGS. 18A-18C are different cross-section diagrams illustrating a partially completed structure formed according to the flow diagram of FIG. 13;

FIGS. 19A-19C are different cross-section diagrams illustrating a partially completed structure formed according to the flow diagram of FIG. 13 and, particularly, an alternative structure as compared to that shown in FIGS. 18A-18C;

FIGS. 20A-20C are different cross-section diagrams illustrating a partially completed structure formed according to the flow diagram of FIG. 13;

FIGS. 23A-23C are different cross-section diagrams illustrating a partially completed structure formed according to the flow diagram of FIG. 13;

FIGS. 24A-24C are different cross-section diagrams illustrating a partially completed structure formed according to the flow diagram of FIG. 13;

FIGS. 25A-25C are different cross-section diagrams illustrating a partially completed structure formed according to the flow diagram of FIG. 13;

FIGS. 26A-26C are different cross-section diagrams illustrating a partially completed structure formed at process 324 of the flow diagram of FIG. 13; and FIGS. 27A-27C are different cross-section diagrams illustrating an alternative partially completed structure formed at process 324 of the flow diagram of FIG. 13;

FIGS. 28A-28C are different cross-section diagrams illustrating a semiconductor structure that is formed according to the flow diagram of FIG. 13 using the partially completed structure of FIGS. 26A-26C and that includes a NWFET 400; and FIGS. 29A-29C are different cross-section diagrams illustrating a semiconductor structure that is formed according to the flow diagram of FIG. 13 using the partially completed structure of FIGS. 27A-27C and that includes a NWFET 400'.

DETAILED DESCRIPTION

As mentioned above, when non-planar field effect transistors (FETs), such as fin-type FETs (FINFETs) and nanowire FETs (NWFETs) are formed as bulk semiconductor structures, the ground plane doping in the bulk semiconductor substrate may not be sufficient for preventing through-substrate and, particularly, sub-channel region source-to-drain leakage (i.e., source-to-drain leakage below the channel region portion of the fin).

In view of the foregoing, disclosed herein are methods of forming a semiconductor structure that includes a non-planar field effect transistor (FET), such as fin-type FET (FINFET) or nanowire FET (NWFET). In the methods, a semiconductor fin can be formed. For a FINFET, the semiconductor fin can be a first semiconductor material. For an NWFET, the semiconductor fin can include alternating layers of a first semiconductor material and a second semiconductor material. A gate structure can be formed on the semiconductor fin. Then, recesses can be formed in the semiconductor fin on either side of the gate structure and can extend vertically to (or into) a semiconductor layer, which is below the fin and made of the second semiconductor material. An oxidation process can then be performed to form oxide layers on exposed semiconductor surfaces. Oxide layers on the first semiconductor material will be a first oxide material and those on the second semiconductor material will be a second oxide material. The first oxide material can be selectively removed and source/drain regions can be formed by lateral epitaxial deposition in the recesses. Also disclose herein are embodiments of a semiconductor structure that includes a non-planar FET structure (e.g., a FINFET or NWFET) form according to the above-describe method so as to have local isolation layers (i.e., the remaining oxide layers), which are below the source/drain regions and which minimize and preferably prevent through-substrate and, particularly, sub-channel region source-to-drain leakage (i.e., source-to-drain leakage below the channel region).

Figure 1:
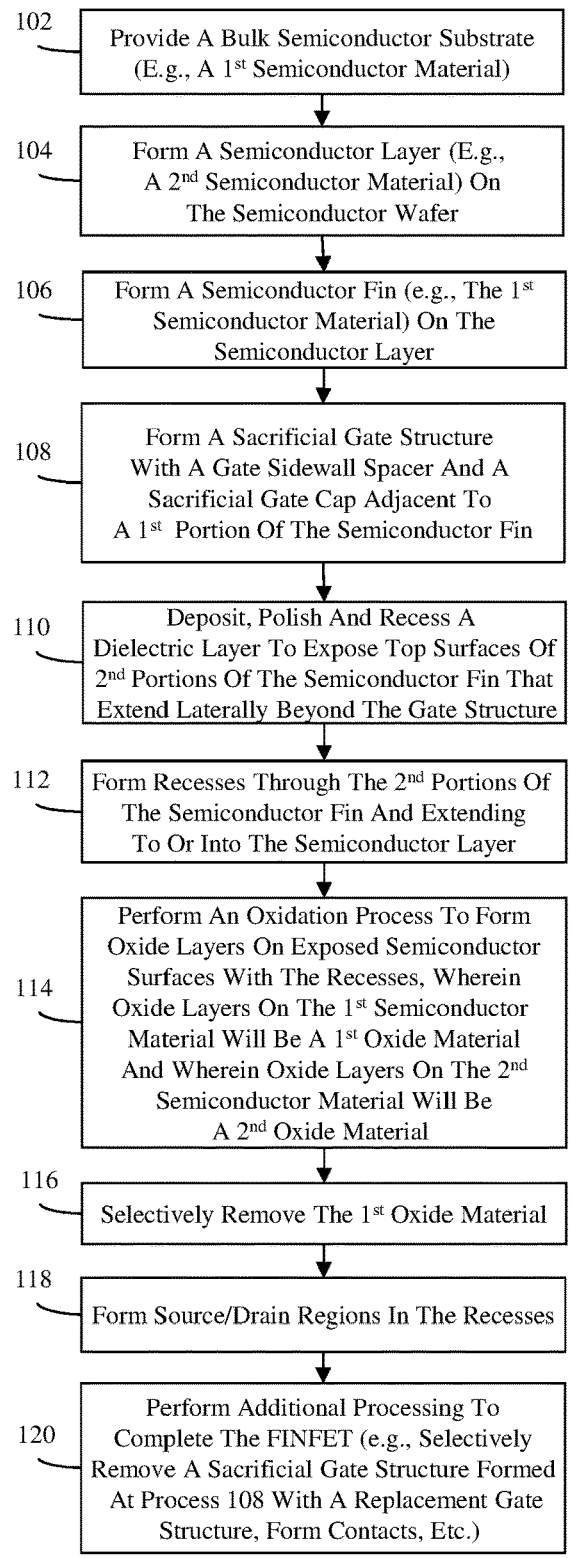
FIG. 1 is a flow diagram illustrating a method of forming a semiconductor structure that includes a fin-type field effect transistor (FINFET)

More particularly, FIG. 1 is a flow diagram illustrating a method of forming a semiconductor structure that includes a fin-type FET (FINFET). The method begins with a bulk semiconductor substrate 201 or wafer (see process 102 and FIG. 2). This bulk semiconductor substrate 201 can, for example, be made of a first semiconductor material (e.g., silicon).

Figure 2:
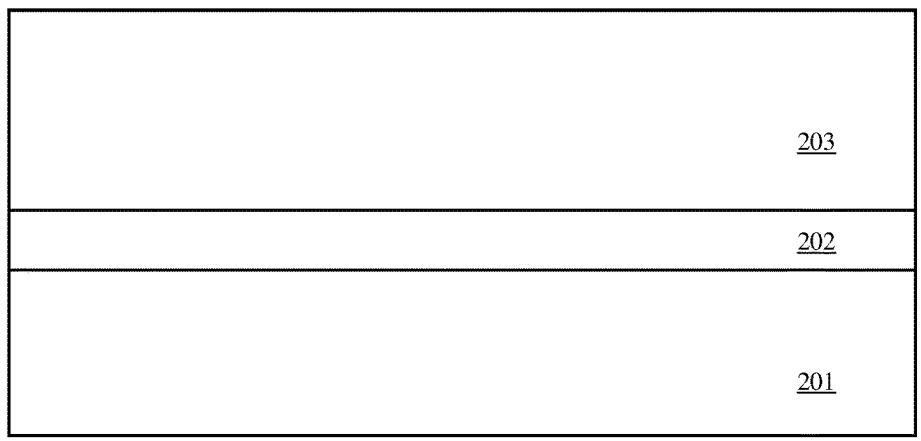
FIG. 2 is a cross-section diagram illustrating a partially completed structure formed according to the flow diagram of FIG. 1.

A semiconductor layer 202 can be formed on a top surface of the semiconductor substrate 201 and an additional semiconductor layer 203 can be formed on a top surface of the semiconductor layer 202 (see process 104 and FIG. 2). The semiconductor layer 202 can be made of a second semiconductor material (e.g., silicon germanium), which is different from the first semiconductor material. This semiconductor layer 202 can be formed, for example, by epitaxial deposition or any other suitable deposition technique. Optionally, this semiconductor layer 202 can be in-situ doped (or subsequently implanted) so as to have a first-type conductivity at a relatively high conductivity level. The additional semiconductor layer 203 can subsequently be formed on the semiconductor layer 202. This additional semiconductor layer 203 can be made of the first semiconductor material (e.g., silicon) and can similarly be formed by epitaxial deposition or any other suitable deposition technique.

Figure 3A:
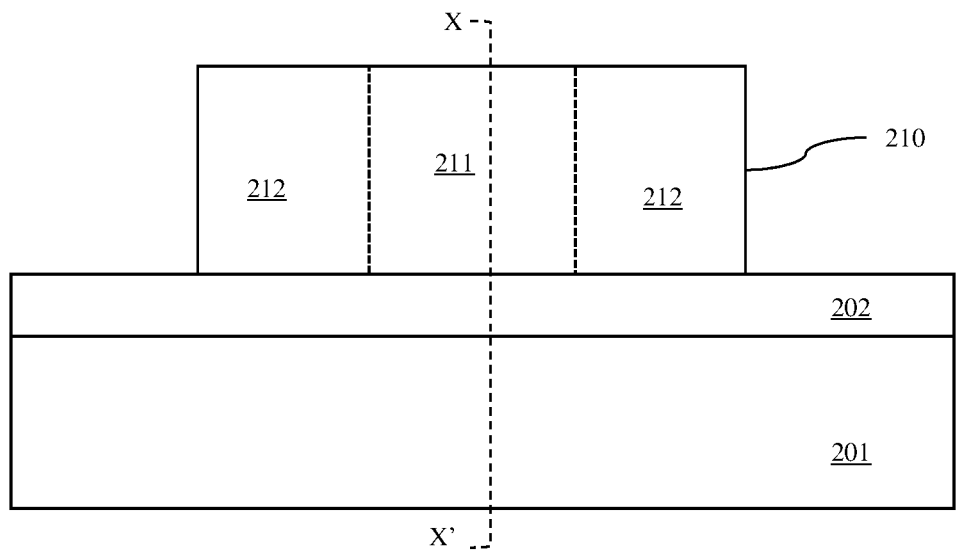
FIGS. 3A-3B are different cross-section diagrams illustrating a partially completed structure formed according to the flow diagram of FIG. 1.
Figure 3B:
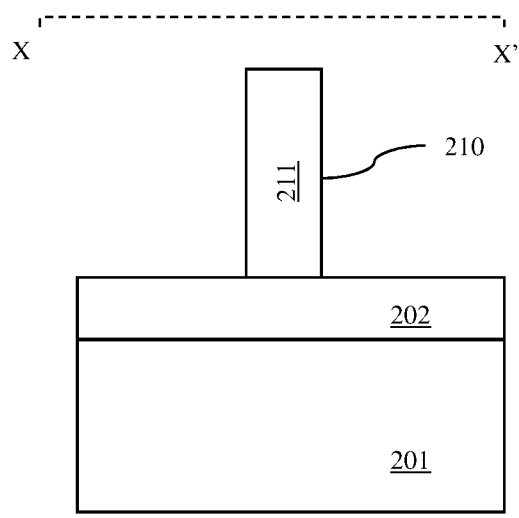

A semiconductor fin 210 can be formed from the additional semiconductor layer 203 above the semiconductor layer 202 (see process 106 and FIGS. 3A-3B). Techniques for forming a semiconductor fin including, but not limited to, conventional lithographic patterning and etch techniques and sidewall image transfer (SIT) techniques, are well known in the art. Thus, the details of such techniques have been omitted from this specification in order to allow the reader to focus on the salient aspects of the disclosed methods. During subsequent processing, a channel region for the FINFET will be formed using a first portion 211 (e.g., a center portion) of the semiconductor fin 210 and source/drain regions for the FINFET will be formed using second portions 212 (e.g., end portions) on opposing sides of the first portion 211. Since the additional semiconductor layer 203 is made of the first semiconductor material (e.g., silicon), so is the resulting semiconductor fin 210.

For purposes of this disclosure, a semiconductor fin refers to a relatively thin, tall, elongated semiconductor body. The semiconductor fin can be formed (e.g., patterned) so as to be essentially rectangular in shape. That is, the semiconductor fin can have an essentially uniform width and height across the length of the semiconductor fin (e.g., in the first portion 211 and the second portions 212). Alternatively, the semiconductor fin could be formed (e.g., patterned) so as to have a first width in the first portion 211 and a second width, which is greater than the first width, in the second portions 212.

Optionally, the semiconductor fin 210 can be doped (e.g., prior to patterning or after patterning) so as to have the first-type conductivity at a relatively low conductivity level and, thus, such that the channel region of the FINFET being formed will have this same conductivity. Alternatively, the semiconductor fin 210 can remain undoped such that the channel region of the FINFET being formed will also be undoped.

Figure 4A:
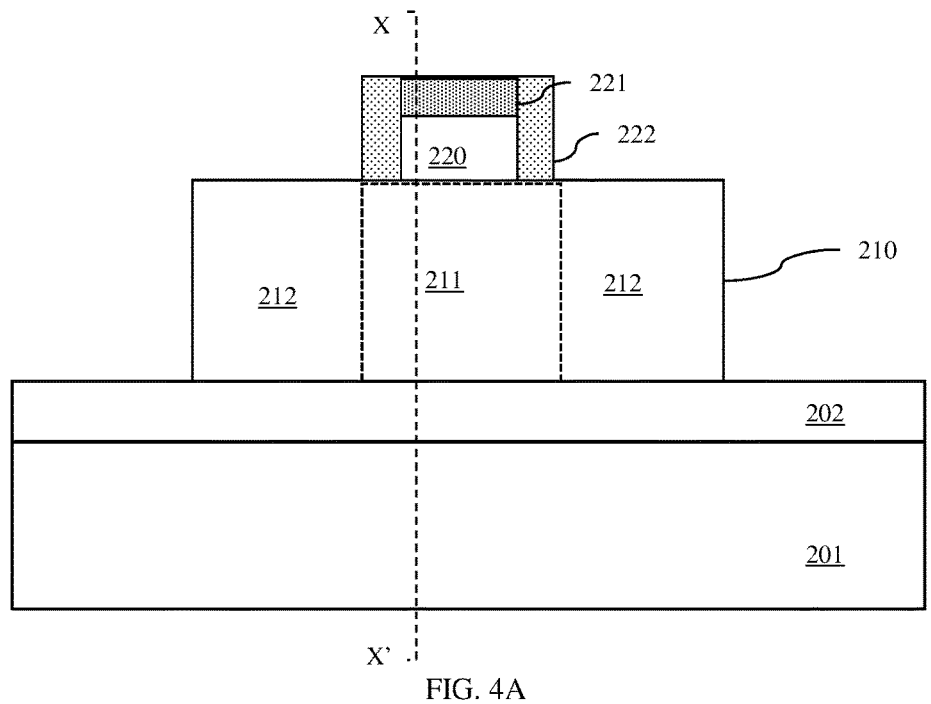
FIGS. 4A-4B are different cross-section diagrams illustrating a partially completed structure formed according to the flow diagram of FIG. 1.
Figure 4B:
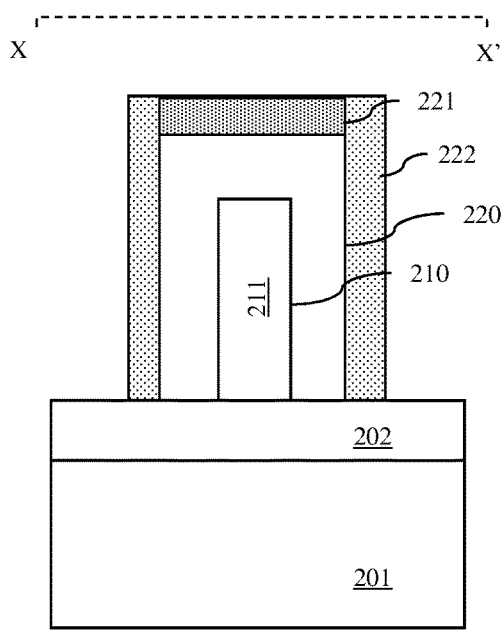

A sacrificial gate structure 220, having a sacrificial gate cap 221 and a gate sidewall spacer 222, can be formed adjacent to the opposing sides and top surface of the first portion 211 of the semiconductor fin 210 (see process 108 and FIGS. 4A-4B). This sacrificial gate structure 220 will function as a placeholder for subsequent replacement metal gate (RMG) processing (discussed in greater detail below at process 120). More specifically, a sacrificial gate stack can be formed over the semiconductor fin. In one exemplary embodiment, the sacrificial gate stack can include multiple dielectric layers including at least a blanket dielectric layer and a dielectric cap layer on the blanket dielectric layer. For example, the blanket dielectric layer can be deposited onto the partially completed structure (e.g., over the semiconductor layer 202 and the semiconductor fin 210) and polished (e.g., using a chemical mechanical polishing (CMP) process) such that it has a thickness that is greater than the height of the semiconductor fin 210 (i.e., such that the top surface of the blanket dielectric layer is above the level of the top surface of the semiconductor fin 210). This blanket dielectric layer can be, for example, a blanket layer of silicon nitride, silicon oxycarbide, silicon carbon nitride, silicon boron carbon, or some other dielectric material that can be selectively etch away from the semiconductor fin 210 and semiconductor layer 202 at process 120 below. The dielectric cap layer can be deposited onto the blanket dielectric layer. The dielectric cap layer can be, for example, a thin layer of silicon nitride or some other suitable dielectric material. Lithographic patterning and etch processes can then be performed in order to form, from this sacrificial gate stack, a sacrificial gate structure 220 having a sacrificial gate cap 221 (as illustrated). A gate sidewall spacer 222 can further be formed on the sidewalls of the sacrificial gate structure 220, as illustrated in FIGS. 4A-4B. To form the gate sidewall spacer 222, a relatively thin conformal dielectric spacer layer can be deposited over the partially completed structure. An anisotropic etch process can then be performed so as to remove the conformal dielectric spacer layer from horizontal surfaces, thereby forming the gate sidewall spacer 222 on the essentially vertical surfaces of the sacrificial gate structure 220. It should be noted that the dielectric material of the dielectric spacer layer should be a different dielectric material than that used for the sacrificial gate structure 220 so that when the sacrificial gate structure 220 is selectively etch away from the semiconductor fin 210 and semiconductor layer 202 at process 120 below, the gate sidewall spacer 222 remains intact. For example, if the sacrificial gate structure 220 is a silicon nitride structure, then the dielectric spacer layer used for the gate sidewall spacer 222 could be a relatively thin conformal silicon oxycarbide spacer layer.

Figure 5A:
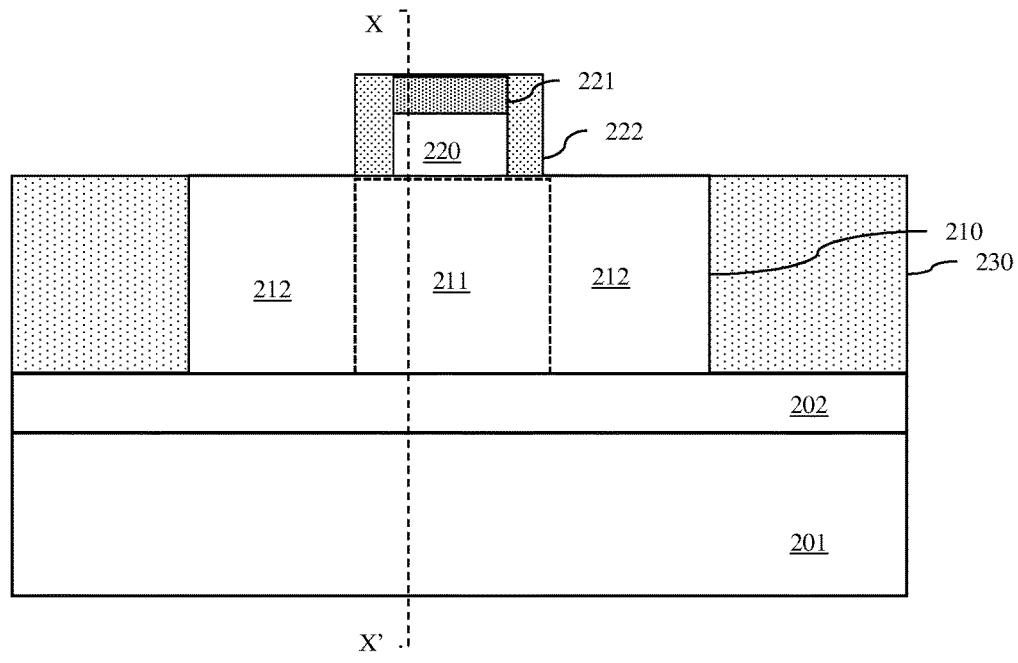
FIGS. 5A-5B are different cross-section diagrams illustrating a partially completed structure formed according to the flow diagram of FIG. 1.
Figure 5B:
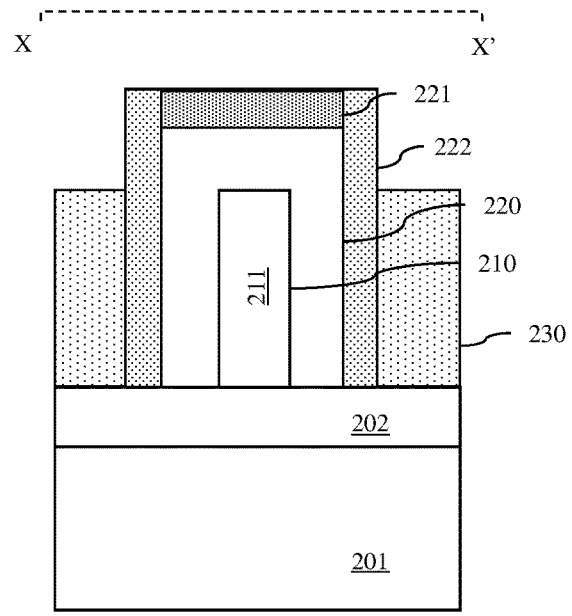

At least one interlayer dielectric (ILD) layer 230 can subsequently be formed on the semiconductor layer 202 (see process 110 and FIGS. 5A-5B). For example, a blanket layer of ILD material can subsequently be deposited onto the semiconductor layer 202, over the semiconductor fin 210, over the gate sidewall spacer 222 and further over the sacrificial gate cap 221 on the sacrificial gate structure 220. This blanket layer of ILD material can be polished (e.g., using a CMP process) and then recessed to expose the top surfaces of the second portions 212 of the semiconductor fin 210. Thus, the resulting ILD layer 230 will be positioned laterally adjacent to sidewalls of the semiconductor fin 210 and, particularly, adjacent to the sidewalls of the second portions 212 of the semiconductor fin 210. The ILD material of this ILD layer 230 should be different from the dielectric materials used for the gate sidewall spacer 222 and for the sacrificial gate structure 220 to allow for recessing the ILD layer 230 without recessing the gate sidewall spacer 222. For example, the ILD material can be silicon dioxide or some other suitable ILD material (e.g., borophosphosilicate glass (BPSG), tetraethyl orthosilicate (TEOS), fluorinated tetraethyl orthosilicate (FTEOS), etc.).

Figure 6A:
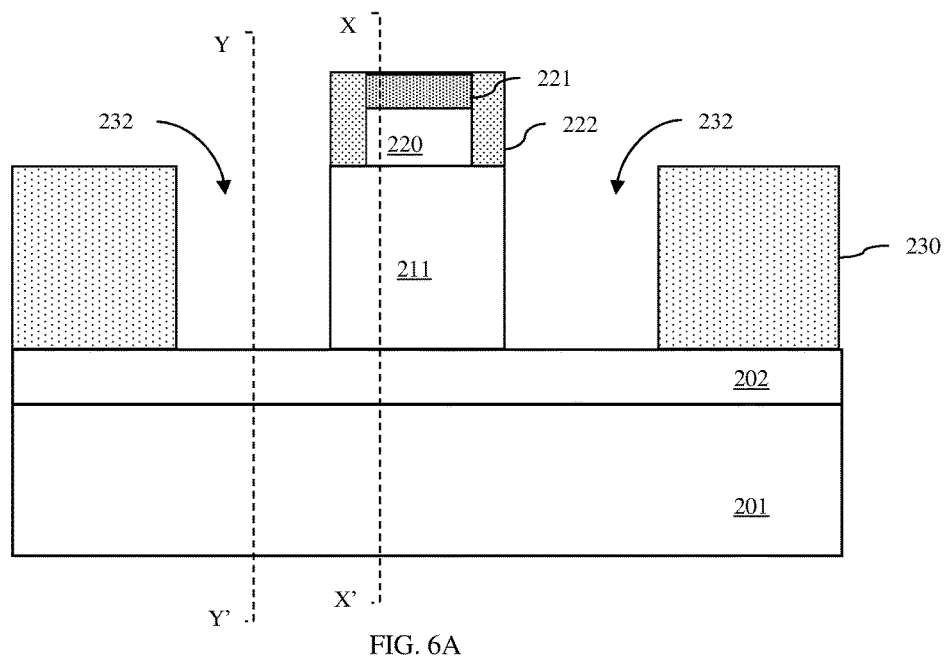
FIGS. 6A-6C are different cross-section diagrams illustrating a partially completed structure formed at process 312 of the flow diagram of FIG. 1.
Figure 6B:
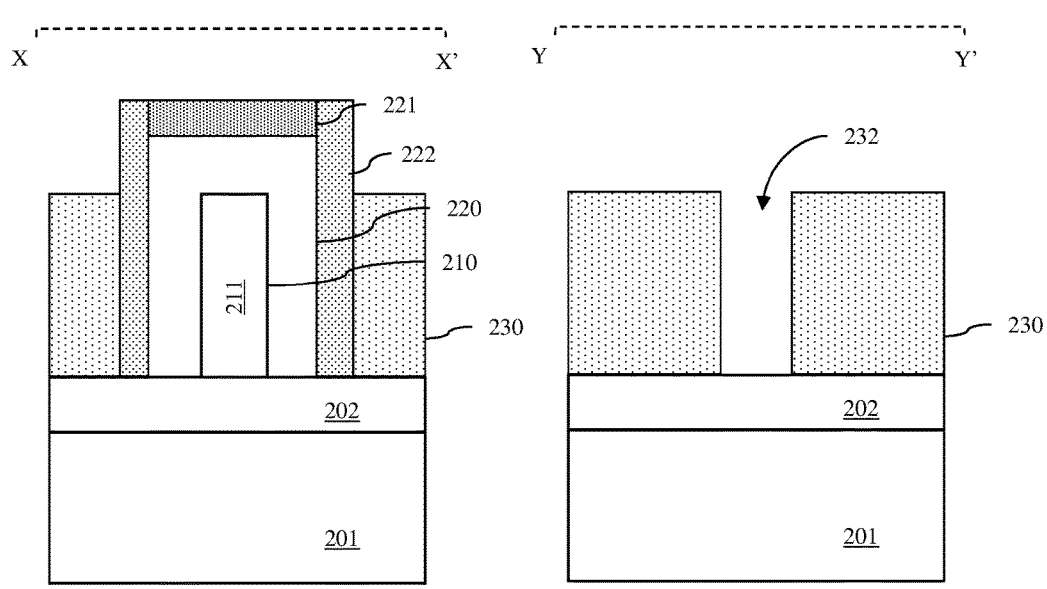
Figure 6C:
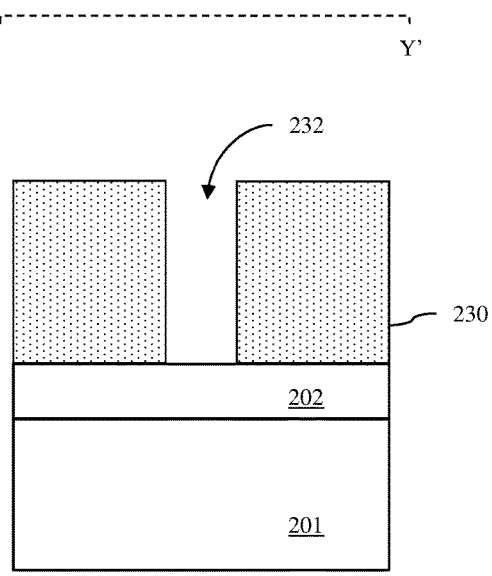

Recesses 232 can then be formed such that they extend completely through the second portions 212 of the semiconductor fin 210 to the top surface of the semiconductor layer 202 below or, alternatively, completely through the second portions 212 of the semiconductor fin 210 and further partially into the semiconductor layer 202 below (see process 112). Specifically, to form the recesses 232, an anisotropic etch process that is selective for the semiconductor material of the semiconductor fin 210 over the adjacent dielectric materials (e.g., over dielectric materials of the ILD layer 230, the gate sidewall spacer 222 and the sacrificial gate cap 221) can be performed. This etch process can stop at the top surface of the semiconductor layer 202, as shown in FIGS. 6A-6C. Alternatively, this etch process can stop when the bottoms of the recesses 232 are some distance below the top surface of the semiconductor layer 202, but still above the bottom surface of the semiconductor layer 202 (see FIGS. 7A-7C).

Figure 7A:
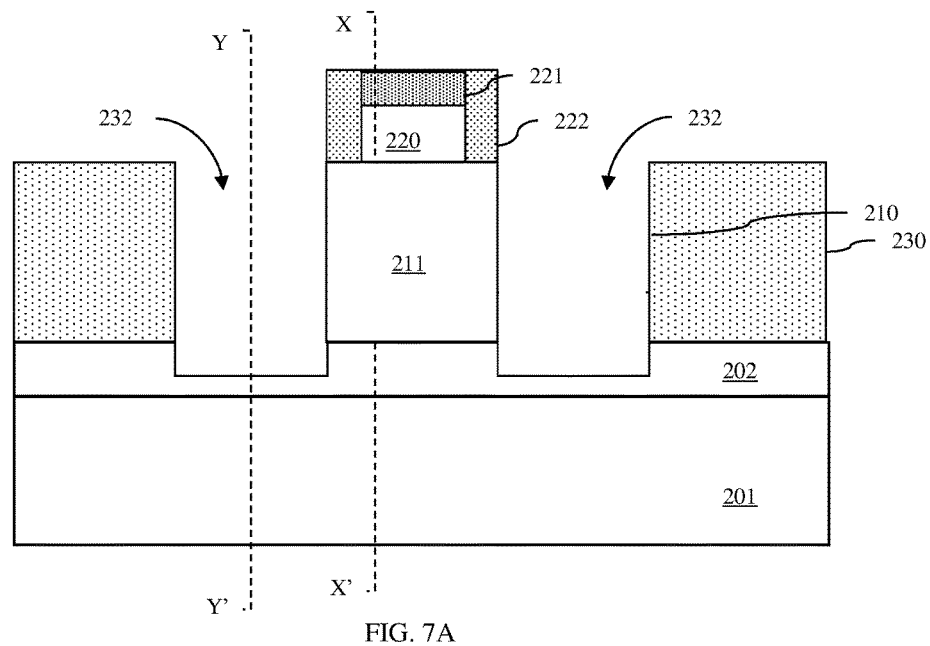
FIGS. 7A-7C are different cross-section diagrams illustrating an alternative partially completed structure formed at process 312 of the flow diagram of FIG. 1.
Figure 7B:
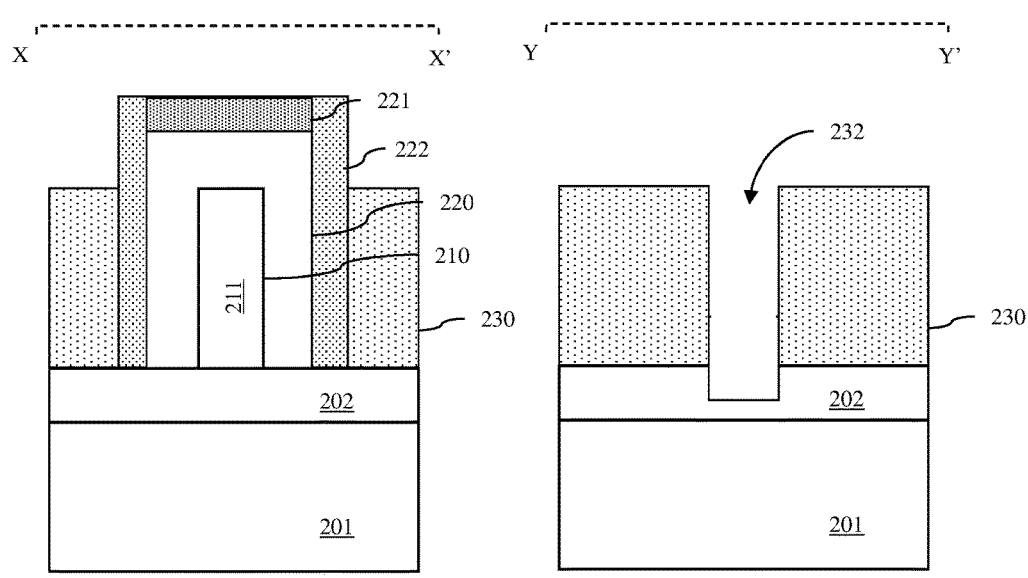
Figure 7C:
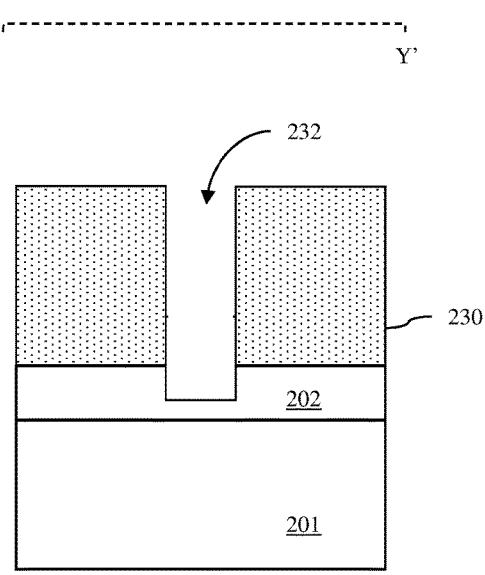
Figure 8A:
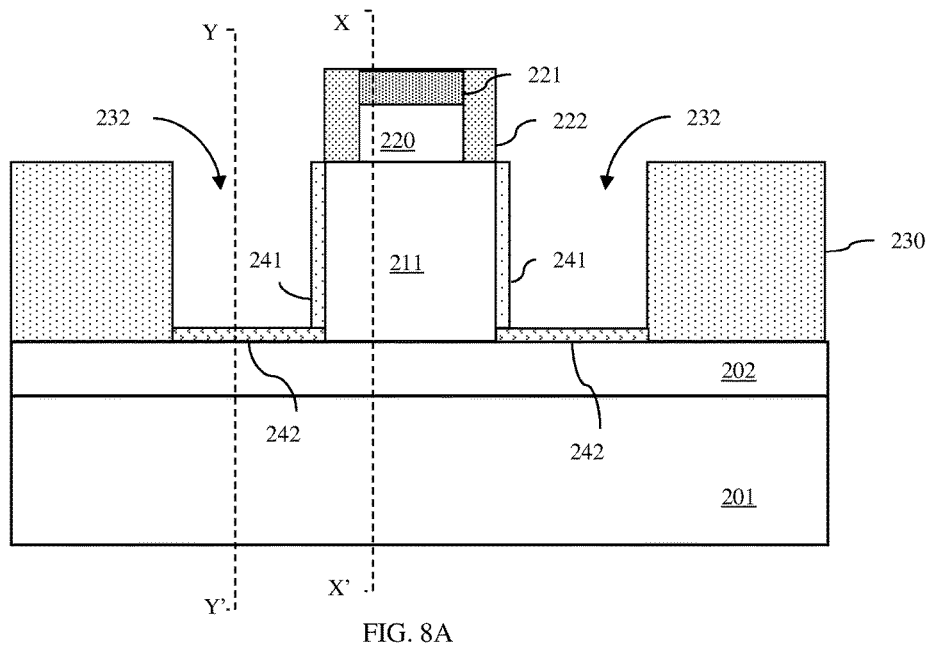
FIGS. 8A-8C are different cross-section diagrams illustrating a partially completed structure formed at process 314 of the flow diagram of FIG. 1 using the partially completed structure of FIGS. 6A-6C.
Figures 8B, 8C:
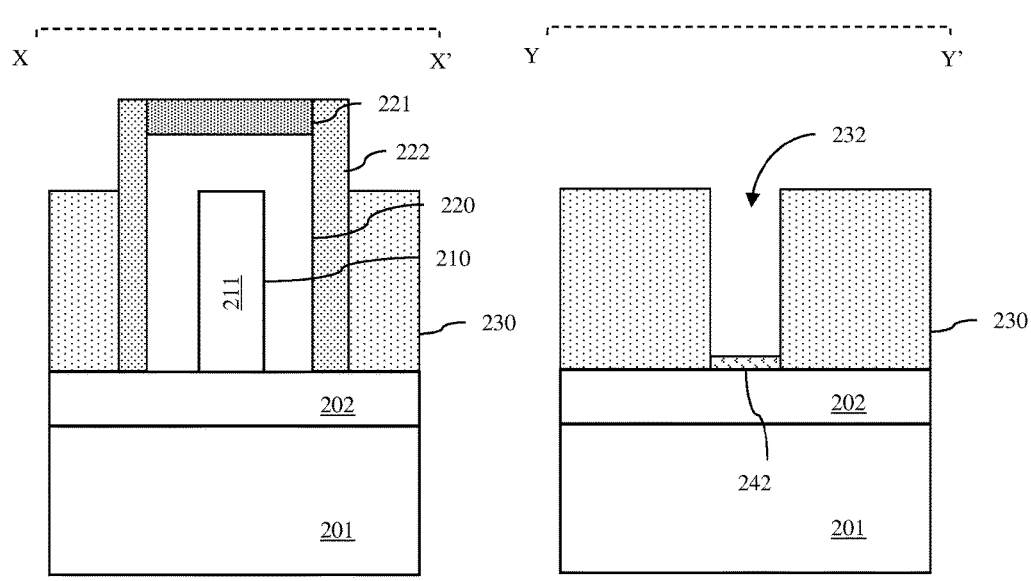

After the recesses 232 are formed, an oxidation process can be performed in order to form oxide layers on exposed semiconductor surfaces within the recesses 232 (i.e., on exposed semiconductor surfaces of the semiconductor layer 202 at the bottoms of the recesses 232 and exposed semiconductor surfaces of the semiconductor fin 210 on the inner sides of the recesses closest to the sacrificial gate structure 220) (see process 114 and FIGS. 8A-8C or FIGS. 9A-9B). Since the semiconductor fin is made of the first semiconductor material and the semiconductor layer 202 is made of the second semiconductor material, the oxide material on these components will vary. Specifically, the oxidation process will result in layers of a first oxide material 241 (e.g., silicon dioxide) being formed on the exposed first semiconductor material surfaces of the semiconductor fin 210 at the inner sides of the recesses 232 and layers of a second oxide material 242 (e.g., silicon germanium oxide), which is different from the first oxide material 241, being formed on the exposed second semiconductor material surfaces of the semiconductor layer 202 at the bottom of the recesses. It should be noted that if the recesses 232 only extend to the top surface of the semiconductor layer 202, as shown in FIGS. 6A-6C, without further extending into the semiconductor layer 202, then the second oxide material 242 will be formed on the top surface only of the semiconductor layer 202 (as shown in FIGS. 8A-8C). However, if the recesses 232 extend partially into the semiconductor layer 202 (as shown in FIGS. 7A-7C), then the second oxide material will be formed at process 114 on vertical and horizontal surfaces of the semiconductor layer 202 within lower portions of the recesses 232 (as shown in FIGS. 9A-9C).

For illustration purposes, the remaining processes of the flow diagram of FIG. 1 are illustrated in the drawings with respect to the partially completed structure shown in FIGS. 9A-9C. However, it should be understood that the drawings are not intended to be limiting and that, alternatively, these same processes could, alternatively, be performed with respect to the partially completed structure shown in FIGS. 8A-8C.

Next, the first oxide material 241 can be selectively removed, leaving oxide layers, which are made of the second oxide material 242 and which are in the bottoms of the recesses 232, intact (see process 116 and FIGS. 10A-10C). For example, a selective isotropic etch process can be performed in order to selectively remove the first oxide material 241 (e.g., silicon dioxide) from the semiconductor fin 210 on the inner sides of the recesses 232 closest to the sacrificial gate structure 220 such that the second oxide material 242 remains essentially intact. One exemplary selective isotropic etch process that could be used at process 116 to selectively etch silicon dioxide over silicon germanium oxide (i.e., to etch silicon dioxide at a significantly faster rate than silicon germanium oxide) is a remote plasma-based ammonium fluoride (NH4F) etch process, such as a SiConi™ process. Alternatively, any other suitable isotropic etch process which etches silicon dioxide at a significantly faster rate than silicon germanium oxide could be used. It should be noted that if the ILD layer 230 is a silicon dioxide layer, then this layer will also be etched back to some degree at process 116 (not shown).

Following removal of the first oxide material 241 at process 116, source/drain regions 213 can be formed in the recesses 232 and the second oxide material 242, which remains intact at the bottoms of the recesses 232, will electrically isolate and physically separate the source/drain regions 213 from the semiconductor layer 202 below (see process 118 and FIGS. 11A-11C). For example, the source/drain regions 213 can be formed by lateral epitaxial deposition of a third semiconductor material on the exposed vertical surfaces of the semiconductor fin 210 within the recesses 232 (i.e., on the inner sides of the recesses 232 closest to the sacrificial gate structure 220). This third semiconductor material of the source/drain regions 213 and the first semiconductor material of the remaining portion 211 (i.e., the channel region) of the semiconductor fin 210 between the source/drain regions 213 can be the same material (e.g., silicon). Alternatively, the third semiconductor material can be different from the first semiconductor material and can be preselected to enhance charge carrier mobility, depending upon the conductivity-type of the FET being formed. For example, for a P-type FET, the third semiconductor material of the source/drain regions 213 could be silicon germanium (SiGe), which will enhance hole mobility within the P-type FET's channel region and, thereby enhance performance. For an N-type FET, the third semiconductor material of the source/drain regions 213 could be silicon carbide (SiC), which will enhance electron mobility within the N-type FET's channel region and, thereby enhance performance.

In any case, the source/drain regions 213 can be in-situ doped (or subsequently implanted) so as to have a second-type conductivity at a relatively high level. This second-type conductivity can be different from the first-type conductivity of the channel region 211 and the semiconductor layer 202 below. Specifically, those skilled in the art will recognize that, for a P-type FET, the first-type conductivity of the channel region 211 can be N-type conductivity and the second-type conductivity of the source/drain regions 213 can be P-type conductivity. In this case, the semiconductor layer 202 below the source/drain regions 213 can, optionally, also be doped so as to have the N-type conductivity, thereby creating diode junctions to further provide protection against any through-substrate and, particularly, sub-channel region source-to-drain leakage (i.e., source-to-drain leakage below the channel region portion of the fin). Contrarily, for an N-type FET, the first-type conductivity of the channel region 211 can be P-type conductivity and the second-type conductivity of the source/drain regions 213 can be N-type conductivity. In this case, the semiconductor layer 202 below the source/drain regions 213 can, optionally, also be doped so as to have the P-type conductivity, thereby creating diode junctions to further provide protection against any through-substrate and, particularly, sub-channel region source-to-drain leakage (i.e., source-to-drain leakage below the channel region portion of the fin).

Additional processing can subsequently be performed in order to complete the FINFET structure 200 (see process 120 and FIGS. 12A-12C). This additional processing can include, but is not limited to, the following: depositing at least one additional ILD layer 235 (e.g., made of the same ILD material as the ILD layer 230 or a different material); polishing the additional ILD layer 235 such that a top surface of the sacrificial gate structure 220 is exposed; selectively removing the sacrificial gate structure 220 to create a gate opening; replacing the sacrificial gate structure 220 with a replacement metal gate (RMG) 225 having a dielectric gate cap 226 (i.e., forming a RMG 225 with a dielectric gate cap 226 in the gate opening); performing middle of the line (MOL) process (e.g., forming contacts to the RMG 225 and the source/drain regions 213 (not shown)); and performing back end of the line (BEOL) processing.

In the above-described method, the following exemplary processes can be used to form the RMG 225. A gate dielectric layer can be conformally deposited so that the exposed top surface and sidewalls of the semiconductor fin 210 at the channel region 211 are covered. Those skilled in the art will recognize that, due to the conformal deposition process, the gate dielectric layer will also cover exposed horizontal surfaces of the semiconductor layer 202 and vertical surfaces of the gate sidewall spacers 222 within the gate opening. The gate dielectric layer can be, for example, high-K gate dielectric layer. Subsequently, a work function metal layer can be conformally deposited in the gate opening over the gate dielectric layer. The metal material or metal alloy material of the conformal work function metal layer can be preselected in order to achieve the optimal gate conductor work function given the conductivity type of the FINFET 200. The work function metal layer can then, optionally, be chamfered. The chamfering process can include: depositing a protective fill material onto the work function metal layer; recessing the protective fill material; etching away the exposed work function metal material from above the protective fill material such that the maximum height of the work function metal layer is below the level of the top surface of the gate sidewall spacer; and removing the protective fill material. A conductive fill material can be deposited to fill any remaining space in the gate opening and a polishing process (e.g., a CMP process) can be performed to remove any RMG materials from above the top surface of the additional ILD layer 235. A dielectric gate cap 226 can then be formed on the top surfaces of the RMG 225. For example, the conductive fill material can be recessed (i.e., etched back) and a dielectric cap layer (e.g., a silicon nitride cap layer) can be deposited over the partially completed structure so as to fill the recess above the conductive fill material. Next, a polishing process (e.g., a CMP process) can be performed so as to remove any of the dielectric cap material from above the top surface of the additional ILD layer 235, thereby forming the dielectric gate cap 226. Since various RMG structures and the methods of making them are well known in the art and could be incorporated into the FET 200 being formed, only the RMG 225, as a whole, is illustrated in FIGS. 12A-12C. The individual components of the RMG 225, including the gate dielectric layer, the work function metal layer, the fill metal, etc., are not specifically illustrated in the figures in order to allow the reader to focus on the salient aspects of the disclosed method.

Figure 13:
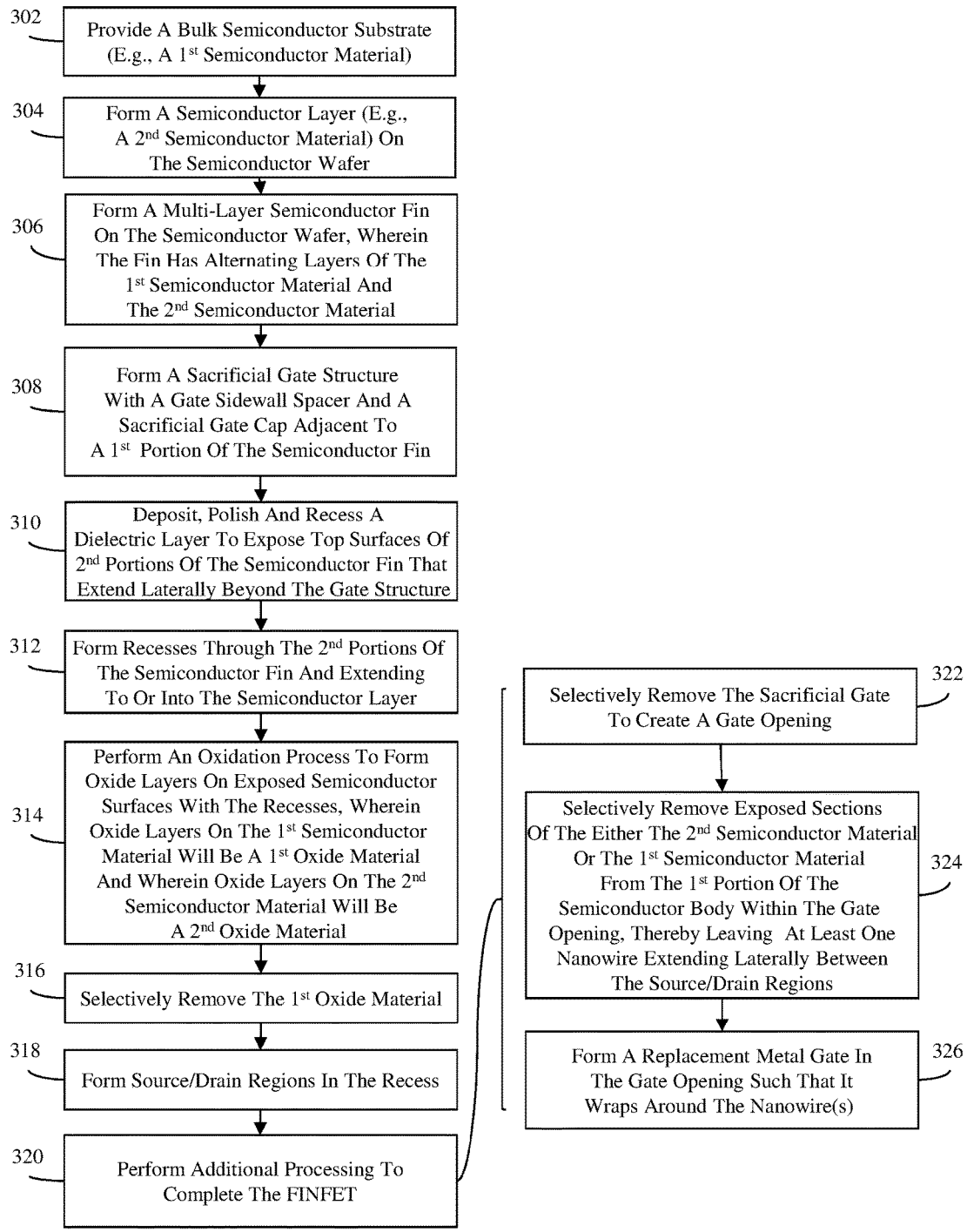
FIG. 13 is a flow diagram illustrating a method of forming a semiconductor structure that includes a nanowire-type field effect transistor (NWFET)

Referring to the flow diagram of FIG. 13, also disclosed herein is a method of forming a semiconductor structure that includes a nanowire FET (NWFET). The method begins with a bulk semiconductor substrate 401 or wafer (302). This bulk semiconductor substrate 401 can, for example, be made of any suitable semiconductor material. For example, the semiconductor substrate 401 can be made of a first semiconductor material (e.g., silicon) or some other suitable semiconductor material.

Figure 14:
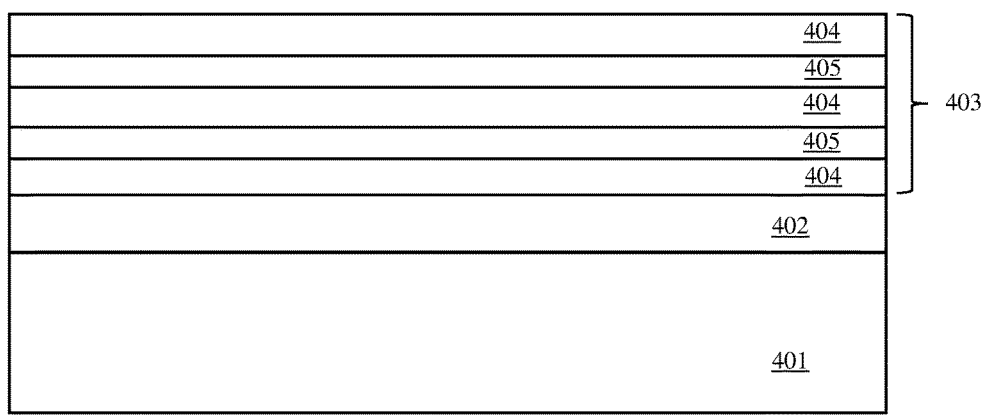
FIG. 14 is a cross-section diagram illustrating a partially completed structure formed according to the flow diagram of FIG. 13.

A semiconductor layer 402 can be formed on a top surface of the semiconductor substrate 401 and a stack 403 of additional semiconductor layers can be formed on a top surface of the semiconductor layer 402 (see process 304 and FIG. 14). The semiconductor layer 402 can be made of a second semiconductor material (e.g., silicon germanium), which is different from the semiconductor substrate 401 and which is, more specifically, different from the first semiconductor material 404 discussed in greater detail below at process 306. This semiconductor layer 402 can be formed, for example, by epitaxial deposition or any other suitable deposition technique. Optionally, this semiconductor layer 402 can be in-situ doped (or subsequently implanted) so as to have a first-type conductivity at a relatively high conductivity level. The stack 403 of additional semiconductor layers can be made of alternating layers of the first semiconductor material 404 (e.g., silicon) and the second semiconductor material 405, which can be formed by epitaxial deposition or any other suitable deposition technique.

Figure 15A:
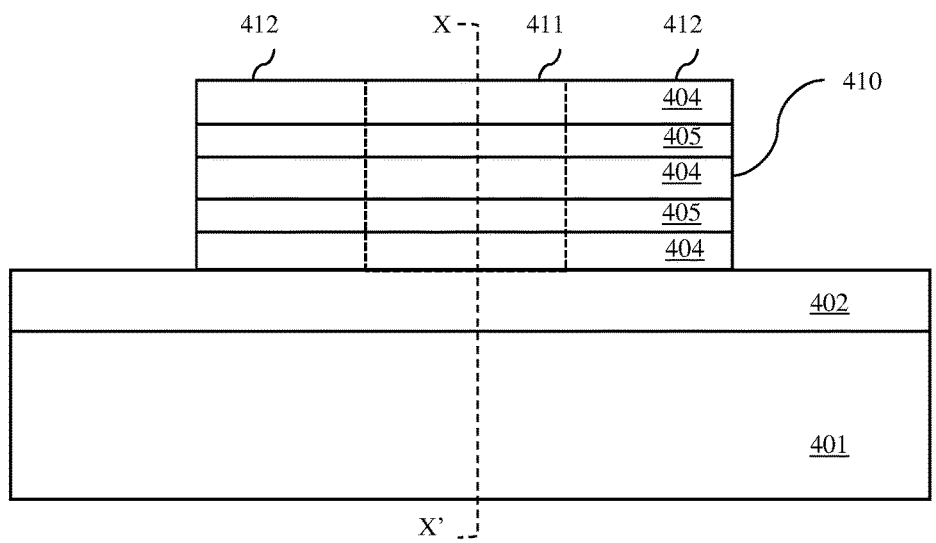
FIGS. 15A-15B are different cross-section diagrams illustrating a partially completed structure formed according to the flow diagram of FIG. 13.
Figure 15B:
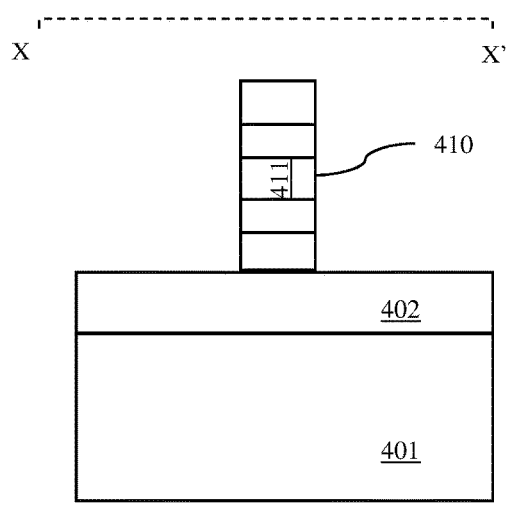
Figure 16A:
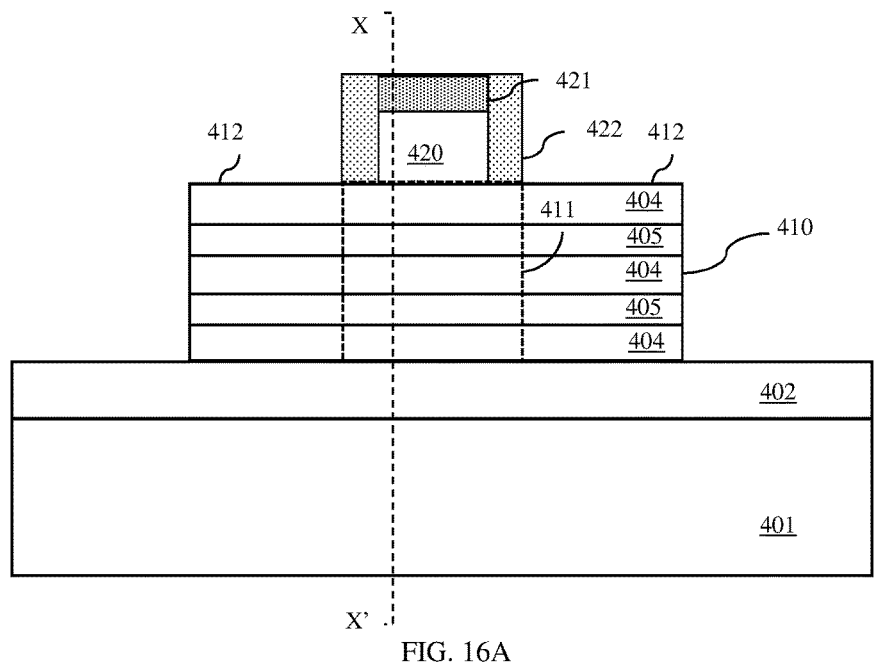
FIGS. 16A-16B are different cross-section diagrams illustrating a partially completed structure formed according to the flow diagram of FIG. 13.
Figure 16B:
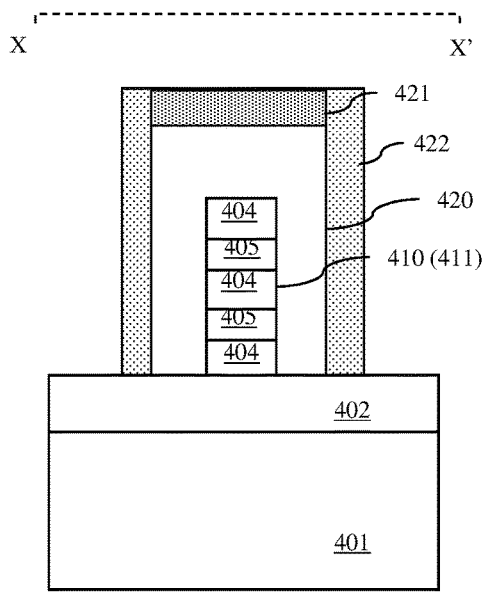

A multi-layer semiconductor fin 410 can be formed from the stack 403 of additional semiconductor layers above the semiconductor layer 402 (see process 306 and FIGS. 15A-15B). Techniques for forming a semiconductor fin including, but not limited to, conventional lithographic patterning and etch techniques and sidewall image transfer (SIT) techniques, are well known in the art. Thus, the details of such techniques have been omitted from this specification in order to allow the reader to focus on the salient aspects of the disclosed methods. During subsequent processing, nanowire channel region(s) for the NWFET will be formed using a first portion 411 (e.g., a center portion) of the multi-layer semiconductor fin 410 and source/drain regions for the NWFET will be formed using second portions 412 (e.g., end portions) on opposing sides of the first portion 411.

For purposes of this disclosure, a semiconductor fin refers to a relatively thin, tall, elongated semiconductor body. The semiconductor fin can be formed (e.g., patterned) so as to be essentially rectangular in shape. That is, the semiconductor fin can have an essentially uniform width and height across the length of the semiconductor fin (e.g., in the first portion 411 and the second portions 412). Alternatively, the semiconductor fin could be formed (e.g., patterned) so as to have a first width in the first portion 411 and a second width, which is greater than the first width, in the second portions 412.

Optionally, the multi-layer semiconductor fin 410 can be doped (e.g., prior to patterning or after patterning) so as to have the first-type conductivity at a relatively low conductivity level and, thus, such that the nanowire channel region(s) of the NWFET being formed using this multi-layer semiconductor fin 410 will have this same conductivity. Alternatively, the multi-layer semiconductor fin 410 can remain undoped such that the channel region of the NWFET being formed will also be undoped.

A sacrificial gate structure 420, having a sacrificial gate cap 421 and a gate sidewall spacer 422, can be formed adjacent to the opposing sides and top surface of the first portion 411 of the multi-layer semiconductor fin 410 (see process 308 and FIGS. 15A-15B). This sacrificial gate structure 420 will function as a placeholder for subsequent replacement metal gate (RMG) processing (discussed in greater detail below at process 320). More specifically, a sacrificial gate stack can be formed over the semiconductor fin. In one exemplary embodiment, the sacrificial gate stack can include multiple dielectric layers including at least a blanket dielectric layer and a dielectric cap layer on the blanket dielectric layer. For example, the blanket dielectric layer can be deposited onto the partially completed structure (e.g., over the semiconductor layer 402 and the multi-layer semiconductor fin 410) and polished (e.g., using a chemical mechanical polishing (CMP) process) such that it has a thickness that is greater than the height of the multi-layer semiconductor fin 410 (i.e., such that the top surface of the blanket dielectric layer is above the level of the top surface semiconductor fin 410). This blanket dielectric layer can be, for example, a blanket layer of silicon nitride, silicon oxycarbide, silicon carbon nitride, silicon boron carbon, or some other dielectric material that can be selectively etch away from the multi-layer semiconductor fin 410 and semiconductor layer 402 at process 320 below. The dielectric cap layer can be deposited onto the blanket dielectric layer. The dielectric cap layer can be, for example, a thin layer of silicon nitride or some other suitable dielectric material. Lithographic patterning and etch processes can then be performed in order to form, from this sacrificial gate stack, a sacrificial gate structure 420 having a sacrificial gate cap 421 (as illustrated). A gate sidewall spacer 422 can further be formed on the sidewalls of the sacrificial gate structure 420, as illustrated in FIGS. 15A-15B. To form the gate sidewall spacer 422, a relatively thin conformal dielectric spacer layer can be deposited over the partially completed structure. An anisotropic etch process can then be performed so as to remove the conformal dielectric spacer layer from horizontal surfaces, thereby forming the gate sidewall spacer 422 on the essentially vertical surfaces of the sacrificial gate structure 420. It should be noted that the dielectric material of the dielectric spacer layer should be a different dielectric material than that used for the sacrificial gate structure 420 so that when the sacrificial gate structure 420 is selectively etch away from the multi-layer semiconductor fin 410 and semiconductor layer 402 at process 320 below, the gate sidewall spacer 422 remains intact. For example, if the sacrificial gate structure 420 is a silicon nitride structure, then the dielectric spacer layer used for the gate sidewall spacer 422 could be a relatively thin conformal silicon oxycarbide spacer layer.

Figure 17A:
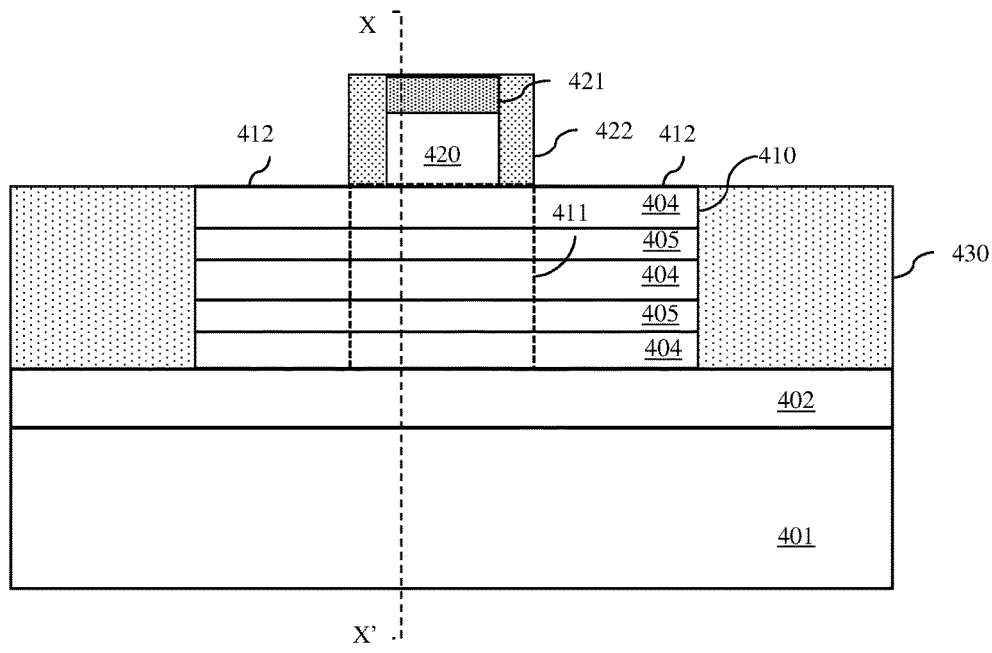
Figure 17B:
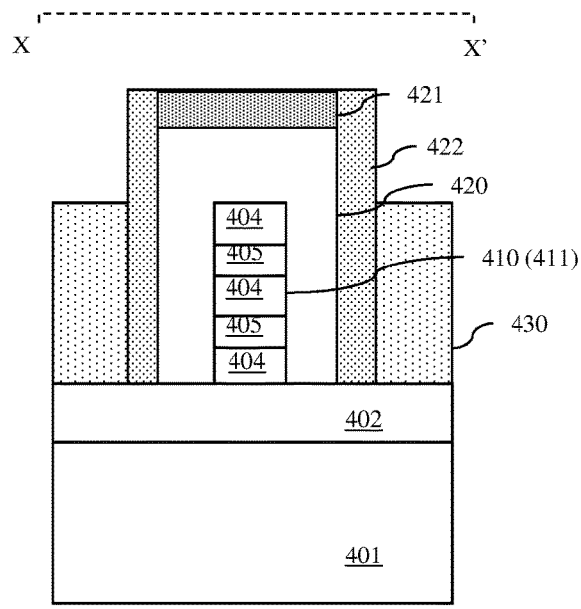

At least one interlayer dielectric (ILD) layer 430 can subsequently be formed on the semiconductor layer 402 (see process 310 and FIGS. 17A-17B). For example, a blanket layer of ILD material can subsequently be deposited onto the semiconductor layer 402, over the multi-layer semiconductor fin 410, over the gate sidewall spacer 422 and further over the sacrificial gate cap 421 on the sacrificial gate structure 420. This blanket layer of ILD material can be polished (e.g., using a CMP process) and then recessed to expose the top surfaces of the second portions 412 of the multi-layer semiconductor fin 410. Thus, the resulting ILD layer 430 will be positioned laterally adjacent to sidewalls of the multi-layer semiconductor fin 410 and, particularly, adjacent to the sidewalls of the second portions 412 of the multi-layer semiconductor fin 410. The ILD material of this ILD layer 430 should be different from the dielectric materials used for the gate sidewall spacer 422 and for the sacrificial gate structure 420 to allow for recessing the ILD layer 430 without recessing the gate sidewall spacer 422. For example, the ILD material can be silicon dioxide or some other suitable ILD material (e.g., borophosphosilicate glass (BPS G), tetraethyl orthosilicate (TEOS), fluorinated tetraethyl orthosilicate (FTEOS), etc.).

Recesses 432 can then be formed such that they extend completely through the second portions 412 of the multi-layer semiconductor fin 410 to the top surface of the semiconductor layer 402 below or, alternatively, completely through the second portions 412 of the semiconductor fin 210 and further partially into the semiconductor layer 402 below (see process 312). Specifically, to form the recesses 432, an anisotropic etch process that is selective for the semiconductor material of the multi-layer semiconductor fin 410 over the adjacent dielectric materials (e.g., over dielectric materials of the ILD layer 430, the gate sidewall spacer 422 and the sacrificial gate cap 421) can be performed. This etch process can stop at the top surface of the semiconductor layer 402, as shown in FIGS. 18A-18C. Alternatively, this etch process can stop when the bottoms of the recesses 432 are some distance below the top surface of the semiconductor layer 402, but still above the bottom surface of the semiconductor layer 402 (see FIGS. 19A-19C).

Figure 21A:
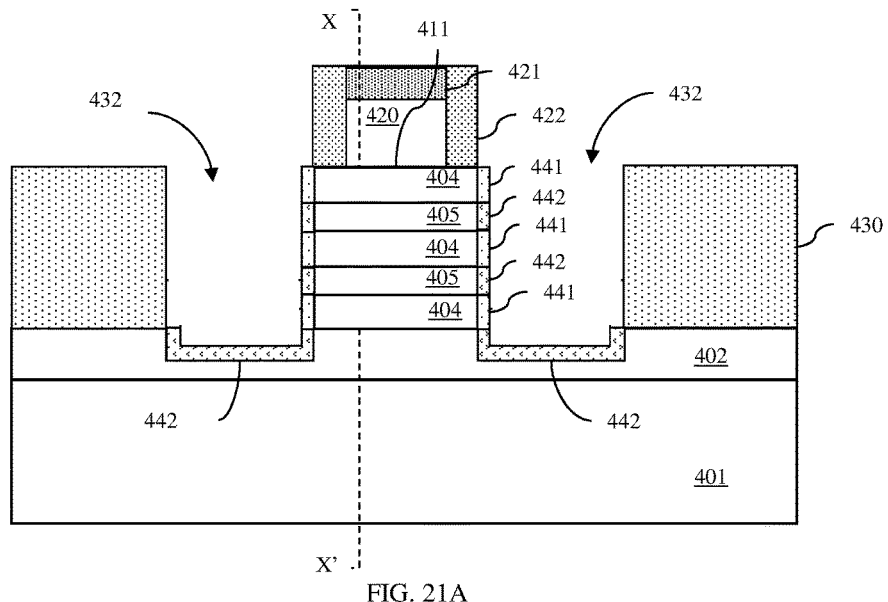
FIGS. 21A-21C are different cross-section diagrams illustrating a partially completed structure formed according to the flow diagram of FIG. 13 and, particularly, an alternative structure as compared to that shown in FIGS. 20A-20C.
Figure 21B:
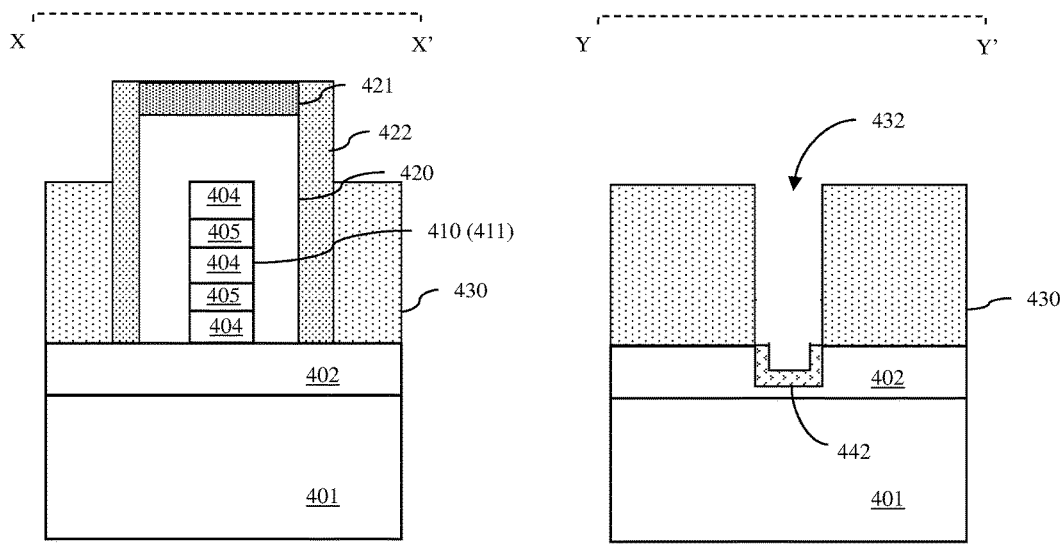
Figure 21C:
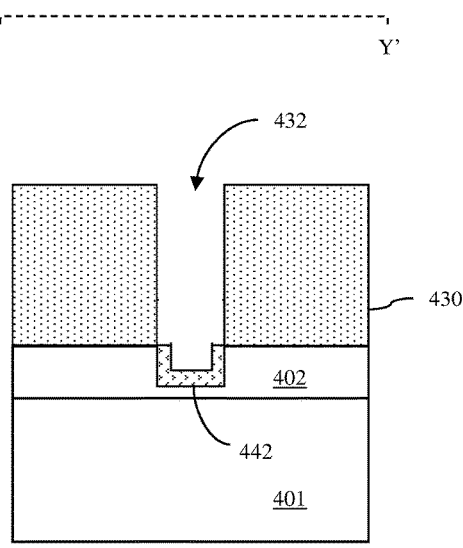

After the recesses 432 are formed, an oxidation process can be performed in order to form oxide layers on exposed semiconductor surfaces within the recesses 432 (i.e., on exposed semiconductor surfaces of the semiconductor layer 402 at the bottoms of the recesses 432 and exposed semiconductor surfaces of the different layers of the multi-layer semiconductor fin 410 on the inner sides of the recesses closest to the sacrificial gate structure 420) (see process 314 and FIGS. 20A-20C or FIGS. 21A-21C). Since the semiconductor materials at the exposed surfaces vary, so will the oxide materials. Specifically, the oxidation process will result in alternating layers of a first oxide material 441 (e.g., silicon dioxide) and a second oxide material 442 that is different from the first oxide material 441 (e.g., silicon germanium oxide) being formed on the exposed surfaces of the alternating layers of the first semiconductor material 404 and the second semiconductor material 405 of the multi-layer semiconductor fin 410 at the inner sides of the recesses 432. This same oxidation process will also result in layers of the second oxide material 442 (e.g., silicon germanium oxide) being formed on the exposed second semiconductor material surfaces of the semiconductor layer 402 at the bottom of the recesses. It should be noted that if the recesses 432 only extend to the top surface of the semiconductor layer 402, as shown in FIGS. 18A-18C, without further extending into the semiconductor layer 402, then the second oxide material 442 will be formed on horizontal surfaces of the semiconductor layer 402, as shown in FIGS. 20A-20C. However, if the recesses 432 extend partially into the semiconductor layer 402 (as shown in FIGS. 19A-19C), then the second oxide material will be formed at process 314 on vertical and horizontal surfaces of the semiconductor layer 402 within lower portions of the recesses 432 (as shown in FIGS. 21A-21C).

For illustration purposes, the remaining processes of the flow diagram of FIG. 13 are illustrated in the drawings with respect to the partially completed structure shown in FIGS. 21A-21C. It should be understood that the drawings are not intended to be limiting and that, alternatively, these same processes could, alternatively, be performed with respect to the partially completed structure shown in FIGS. 20A-20C.

Figure 22A:
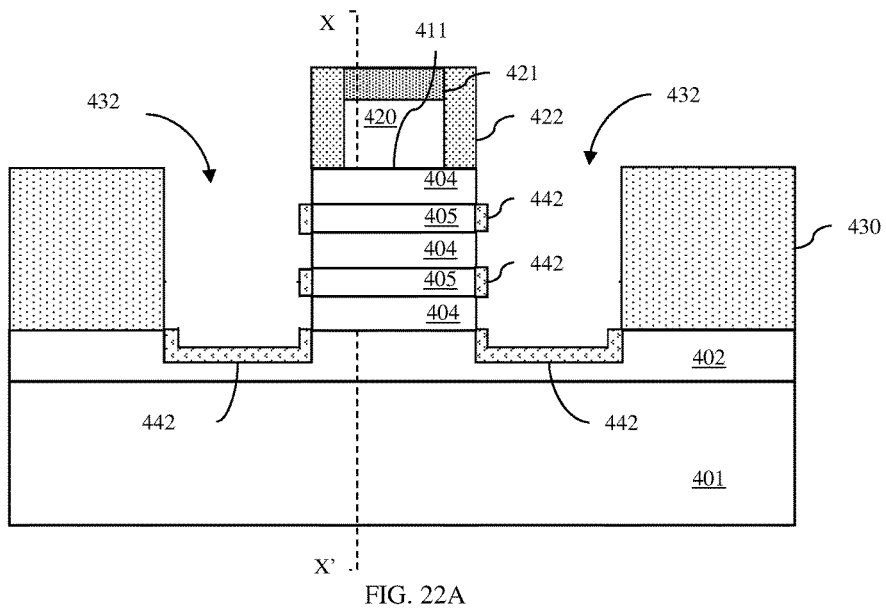
FIGS. 22A-22C are different cross-section diagrams illustrating a partially completed structure formed according to the flow diagram of FIG. 13.
Figure 22B:
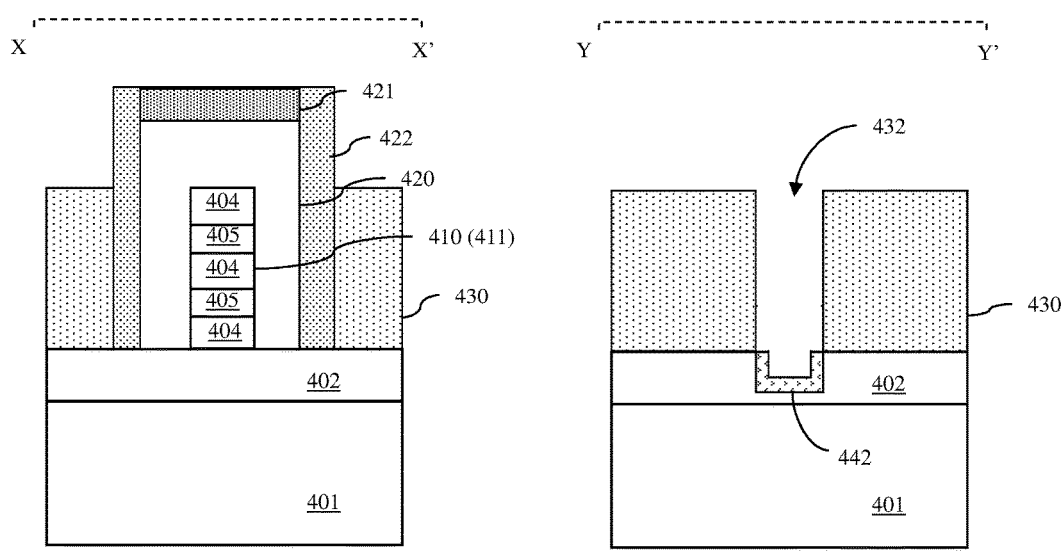
Figure 22C:
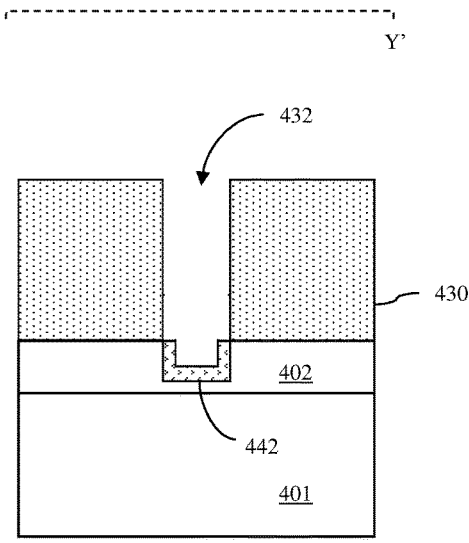

Next, the first oxide material 441 can be selectively removed from the vertical surfaces of the first semiconductor material layers 404 of the multi-layer semiconductor fin 410 on the inner sides of the recesses 432 closest to the sacrificial gate structure 420, leaving intact any oxide layers made of the second oxide material 442 on the bottoms of the recesses 432 as well as on the vertical surfaces of the second semiconductor material layers 405 of the multi-layer semiconductor fin 410 on the inner sides of the recesses 432 closest to the sacrificial gate structure 420 (see process 316 and FIGS. 22A-22C). For example, a selective isotropic etch process can be performed in order to selectively remove the first oxide material 441 (e.g., silicon dioxide) from within the recesses 432 such that the second oxide material 442 remains essentially intact. One exemplary selective isotropic etch process that could be used at process 316 to selectively etch silicon dioxide over silicon germanium oxide (i.e., to etch silicon dioxide at a significantly faster rate than silicon germanium oxide) is a remote plasma-based ammonium fluoride (NH4F) etch process, such as a SiConi™ process. Alternatively, any other suitable isotropic etch process which etches silicon dioxide at a significantly faster rate than silicon germanium oxide could be used. It should be noted that if the ILD layer 430 is a silicon dioxide layer, then the layer will also be etched back to some degree at process 316 (not shown).

Following removal of the first oxide material 441 at process 316, source/drain regions 413 can be formed in the recesses 432 and the second oxide material 442, which remains intact at the bottoms of the recesses 432, will electrically isolate and physically separate the source/drain regions 413 from the semiconductor layer 402 below (see process 318 and FIGS. 23A-23C). For example, the source/drain regions 413 can be formed by lateral epitaxial deposition of a third semiconductor material on the exposed vertical surfaces of the multi-layer semiconductor fin 410 within the recesses 432 (i.e., on the inner sides of the recesses 432 closest to the sacrificial gate structure 420). This third semiconductor material of the source/drain regions 413 and the first semiconductor material of the remaining portion 411 of the multi-layer semiconductor fin 410 between the source/drain regions 413 can be the same material (e.g., silicon). Alternatively, the third semiconductor material can be different from the first semiconductor material and can be preselected to enhance charge carrier mobility, depending upon the conductivity-type of the FIN-FET being formed. For example, for a P-type FET, the third semiconductor material of the source/drain regions 413 could be silicon germanium (SiGe), which will enhance hole mobility within the P-type FET's channel region and, thereby enhance performance. For an N-type FET, the third semiconductor material of the source/drain regions 413 could be silicon carbide (SiC), which will enhance electron mobility within the N-type FET's channel region and, thereby enhance performance.

In any case, the source/drain regions 413 can be in-situ doped (or subsequently implanted) so as to have a second-type conductivity at a relatively high level. This second-type conductivity can be different from the first-type conductivity of the remaining portion 411 of the fin that will be used to form nanowire channel region(s) and the semiconductor layer 402 below. Specifically, those skilled in the art will recognize that, for a P-type FET, the first-type conductivity of the channel region(s) can be N-type conductivity and the second-type conductivity of the source/drain regions 413 can be P-type conductivity. In this case, the semiconductor layer 402 below the source/drain regions 413 can, optionally, also be doped so as to have the N-type conductivity, thereby creating diode junctions to further provide protection against any through-substrate and, particularly, sub-channel region source-to-drain leakage (i.e., source-to-drain leakage below the nanowire(s)). Contrarily, for an N-type FET, the first-type conductivity of the channel region(s) can be P-type conductivity and the second-type conductivity of the source/drain regions 413 can be N-type conductivity. In this case, the semiconductor layer 402 below the source/drain regions 413 can, optionally, also be doped so as to have the P-type conductivity, thereby creating diode junctions to further provide protection against any through-substrate and, particularly, sub-channel region source-to-drain leakage (i.e., source-to-drain leakage below the nanowire(s)).

Additional processing can subsequently be performed in order to complete the NWFET structure 400 (see process 320 and FIGS. 24A-27C). This additional processing can include, for example, deposition of at least one additional ILD layer 435 (e.g., made of the same ILD material as the ILD layer 430 or a different material). The additional ILD layer 435 can be polished (e.g., using a CMP process) such that a top surface of the sacrificial gate structure 420 is exposed (see FIGS. 24A-24C). The sacrificial gate structure 420 can then be selectively removed, thereby creating a gate opening 429 (see process 322 and FIGS. 25A-25C). Creation of the gate opening 429 exposes the top surface and opposing sidewalls of the first portion 411 of the multi-layer semiconductor fin 410.

Next, exposed sections of either the second semiconductor material 405 or the first semiconductor material 404 can be selectively removed from within the first portion 411, thereby forming one or more nanowires 411a-c or 411'a-b, respectively (see process 324 and FIGS. 26A-26C or FIGS. 27A-27C).

Specifically, at process 324 a selective isotropic etch process can be performed that is selective for the second semiconductor material over the first semiconductor material. For example, if the first semiconductor material 404 is silicon and the second semiconductor material 405 is silicon germanium, the silicon germanium can be selectively etched using any of the following exemplary processes: a thermal etch process (e.g., using gaseous hydrochloric acid (HCl)), a dry plasma etch process, or wet etch process with process specifications designed to ensure the selective etch of silicon germanium over silicon and silicon nitride. Alternatively, any other suitable isotropic selective etch process that selectively etches silicon germanium over silicon could be used. As a result, as illustrated in FIGS. 26A-26C, only sections of the first semiconductor material 404 that extend laterally between the source/drain regions 413 will remain in the first portion 411 and these remaining sections of the first semiconductor material 404 effectively form nanowires or, more particularly, nanowire channel regions 411a-c (e.g., silicon nanowire channel regions). As mentioned above, the semiconductor layer 402 is similarly made of the second semiconductor material such that this selective isotropic etch process 324 will also etch out the semiconductor layer 402 below the first portion 411 of the semiconductor body, thereby exposing the bottom surface of the lowest nanowire channel region 411a. Depending upon the etch time required to expose the bottom surface of the lowest nanowire channel region 411a, the recess formed in the semiconductor layer 402 may extend only partially into the semiconductor layer 402 (as shown) or may extend completely through the semiconductor layer 402 to the top surface of the substrate 401.

Alternatively, between the process 316 of removing the first oxide material and the 318 of forming source/drain regions 413, as discussed in detail above, segments of the second oxide material 442 adjacent to the semiconductor layer 402 can be protected and segments of the second oxide material 442 positioned laterally adjacent to vertical surfaces of the layers of the second semiconductor material 405 in the first portion 411 can be selectively removed. Then, at process at process 324, a selective isotropic etch process can be performed that is selective for the first semiconductor material over the second semiconductor material. For example, if the first semiconductor material 404 is silicon and the second semiconductor material 405 is silicon germanium, the silicon can be selectively etched using, for example, a plasma-based dry etch process or other suitable etch process that selectively etches silicon over silicon germanium and silicon nitride. As a result, as illustrated in FIGS. 27A-27C, only sections of the second semiconductor material 405 that extend laterally between the source/drain regions 413 will remain in the first portion 411 and these remaining sections of the second semiconductor material 405 effectively form nanowires or, more particularly, silicon germanium nanowire channel regions 411'a-b (e.g., silicon germanium nanowire channel regions) and the lowest of theses nanowire channel regions 411'a is physically separated from the top surface of the semiconductor layer 402.

Subsequently, a replacement metal gate (RMG) 425 having a dielectric gate cap 426 can be formed in the gate opening (see process 326), middle of the line (MOL) processing can be performed (not shown), and back end of the line (BEOL) processing can be performed in order to complete the NWFET structure 400 with nanowires 411a-c, as shown in FIGS. 28A-28C, or the alternative NWFET structure 400' with nanowires 411'a-b as shown in FIGS. 29A-29C.

In the above-described method, the following exemplary processes can be used to form the RMG 425 adjacent to the nanowire channel regions 411*a-c* of the NWFET structure 400 or adjacent to the nanowire channel regions 411'*a-b* of the NWFET structure 400'.

Additional dielectric sidewall spacers can be formed on vertical surfaces within the gate opening to ensure that the source/drain regions 413 will be electrically isolated from the RMG 425. Specifically, the additional dielectric sidewall spacers can be formed such that they are positioned laterally adjacent to vertical surfaces of the gate sidewall spacers 422 and also positioned around the ends of the nanowires and positioned laterally adjacent to vertical surfaces of the source/drain regions 413. Techniques for forming sidewall spacers are well known in the art. Thus, the details of these techniques have been omitted from the present application in order to allow the reader to focus on the salient aspect of the disclosed method.

A gate dielectric layer can be conformally deposited so that the exposed surfaces of the nanowire channel regions 411*a-c*, 411'*a-b* are covered (i.e., so that the gate dielectric layer wraps completely around each of the nanowire channel regions 411*a-c*, 411'*a-b*). Those skilled in the art will recognize that, due to the conformal deposition process, the gate dielectric layer may also cover other exposed surfaces within the gate opening (e.g., exposed surfaces of additional dielectric sidewall spacers, of the semiconductor layer 402, of the substrate 401 (if applicable), and of the gate sidewall spacers 422). The gate dielectric layer can be, for example, high-K gate dielectric layer.

Subsequently, a work function metal layer can be conformally deposited in the gate opening so as to cover the gate dielectric layer on each nanowire channel region. The metal material or metal alloy material of the conformal work function metal layer can be preselected in order to achieve the optimal gate conductor work function given the conductivity type of the NWFET 400 of FIGS. 28A-28C or the NWFET 400' of FIGS. 29A-29C being formed. The work function metal layer can then, optionally, be chamfered. The chamfering process can include: depositing a protective fill material onto the work function metal layer; recessing the protective fill material; etching away the exposed work function metal material from above the protective fill material such that the maximum height of the work function metal layer is below the level of the top surface of the gate sidewall spacer; and removing the protective fill material.

A conductive fill material can be deposited to fill any remaining space in the gate opening and a polishing process (e.g., a CMP process) can be performed to remove any RMG materials from above the top surface of the additional ILD layer 435. A dielectric gate cap 426 can then be formed on the top surfaces of the RMG 425. For example, the conductive fill material can be recessed (i.e., etched back) and a dielectric cap layer (e.g., a silicon nitride cap layer) can be deposited over the partially completed structure so as to fill the recess above the conductive fill material. Next, a polishing process (e.g., a CMP process) can be performed so as to remove any of the dielectric cap material from above the top surface of the additional ILD layer 435, thereby forming the dielectric gate cap 426.

Since various RMG structures and the methods of making them are well known in the art and could be incorporated into the NWFET structures 400 or 400' being formed, only the RMG 425, as a whole, is illustrated in FIGS. 28A-28C and FIGS. 29A-29C. The individual components of the RMG 425, including the additional dielectric sidewall spacers, the gate dielectric layer, the work function metal layer, the conductive fill material, etc., are not specifically illustrated in the figures in order to allow the reader to focus on the salient aspects of the disclosed method.

For purposes of illustration, the stack 403 of alternating layers of the first semiconductor material 404 and the second semiconductor material 405 shown in FIG. 14 includes a total of 5 layers. The resulting NWFET 400 shown in FIGS. 28A-28C includes three horizontal, stacked, nanowire channel regions 411*a-c* made of the first semiconductor material (e.g., silicon). The resulting NWFET 400' shown in FIGS. 28A-28C includes two horizontal, stacked, nanowire channel regions 411'*a-b* made of the second semiconductor material (e.g., silicon germanium). It should, however, be understood that the description and figures are not intended to be limiting. Alternatively, the stack could include a lesser number of alternating layers of the first semiconductor material 404 and the second semiconductor material 405 such that resulting NWFET has a lesser number (e.g., 1 or 2) of nanowire channel regions. Alternatively, the stack 403 could include a greater number (e.g., 4 or more) of alternating layers of the first semiconductor material 404 and the second semiconductor material 405 such that resulting NWFET has a greater number of nanowire channel regions.

Also disclosed herein are semiconductor structures formed according to the above-described methods (e.g., see the semiconductor structure shown in FIGS. 12A-12C and the semiconductor structures 400 and 400' shown in FIGS. 28A-28C and 29A-29C, respectively).

These semiconductor structures 200, 400, 400' can include a bulk semiconductor substrate 201, 401. This bulk semiconductor substrate 201, 401 can, for example, be made of a semiconductor material. The semiconductor material of the substrate 201, 401 can be the same as the first semiconductor material (e.g., silicon) described below. Alternatively, the semiconductor material can be any other suitable semiconductor material.

These semiconductor structures 200, 400, 400' can further include semiconductor layer 202, 402 on the bulk semiconductor substrate 201, 401. This semiconductor layer 202, 402 can be made of a second semiconductor material (e.g., silicon germanium), which is different different the first semiconductor material and, if the substrate is made of some other semiconductor material, different from the semiconductor material of the substrate. Optionally, this semiconductor layer 202, 402 can be doped so as to have a first-type conductivity at a relatively high conductivity level.

These semiconductor structures 200, 400, 400' can further include a non-planar field effect transistor (FET) on the semiconductor layer 202, 402. The non-planar FET can be, for example, a fin-type FET (FINFET) 200, as shown in FIGS. 12A-12C, or a nanowire FET (NWFET) 400, as shown in FIGS. 28A-28C, or a NWFET 400' as shown in FIGS. 29A-29C.

In any case, each FET 200, 400, 400' can include: source/drain regions 213, 413 with a second-type conductivity at a relatively high conductivity level; at least one channel region 211, 411*a-c*, 411' *a-b* extending laterally between the source/drain regions 213, 413 and optionally having the first-type conductivity at a relatively low conductivity level; and a replacement metal gate (RMG) 225, 425 adjacent to the channel region(s) 211, 411*a-c*, 411'*a-b*.

Referring to the FINFET 200 of FIGS. 12A-12C, the channel region 211 can be a single fin-shaped channel region that has a bottom surface immediately adjacent to the semiconductor layer 202 and that extends laterally between the source/drain regions 213. The RMG 225 can be positioned adjacent to the top surface and opposing sides of the channel region 211.

Referring to the NWFET 400 of FIGS. 28A-28C and the NWFET 400' of FIGS. 29A-29C, alternatively, the channel region(s) can be in the form of one or more nanowires (see the nanowire channel regions 411a-c in the NWFET 400 and nanowire channel regions 411'a-b in the NWFET 400') that extend laterally between the source/drain regions 413. As illustrated, multiple nanowire channel regions can be horizontally oriented, aligned one above the other and physically separated from each other and from the semiconductor layer 402. The RMG 425 can wrap fully around each nanowire channel region 411a-c, 411'a-b.

The channel region 211 of the FINFET 200 can be made of the first semiconductor material (e.g., silicon). The nanowire channel region(s) of the NWFETs can be made of either the first semiconductor material (e.g., silicon) or the second semiconductor material (e.g., silicon germanium). For example, as described in detail above with regard to the method, the nanowire channel regions 411a-c of the NWFET structure 400 are made of the first semiconductor material (e.g., are silicon nanowire channel regions) and the nanowire channel regions 411'a-b of the NWFET 400' are made of the second semiconductor material (e.g., are silicon germanium nanowire channel regions).

The source/drain regions 213, 413 can be made of a third semiconductor material. This third semiconductor material of the source/drain regions 213, 413 can be the same as the first semiconductor material (e.g., silicon). Alternatively, the third semiconductor material can be different from the first semiconductor material and can be preselected to enhance charge carrier mobility, depending upon the conductivity-type of the FET. For example, for a P-type FET, the third semiconductor material of the source/drain regions 213, 413 could be silicon germanium (SiGe), which will enhance hole mobility within the P-type FET's channel region and, thereby enhance performance. For an N-type FET, the third semiconductor material of the source/drain regions 213, 413 could be silicon carbide (SiC), which will enhance electron mobility within the N-type FET's channel region and, thereby enhance performance.

In the NWFETs 400, 400', the RMG 425 can include additional dielectric sidewall spacers on vertical surfaces within the gate opening and, particularly, positioned laterally adjacent to vertical surfaces of the gate sidewall spacers 422 and also positioned around the ends of the nanowires and positioned laterally adjacent to vertical surfaces of the source/drain regions 413 in order to ensure that the source/drain regions 413 are electrically isolated from the RMG 425.

In the FINFET 200 and in the NWFETs 400, 400', the RMG 225, 425 can further include a conformal gate dielectric layer immediately adjacent to the channel region(s) 211, 411a-c, 411'a-b. The gate dielectric layer can be, for example, high-K gate dielectric layer. The RMG 225, 425 can further include a conformal work function metal layer on the gate dielectric layer. The metal material or metal alloy material of the conformal work function metal layer can be preselected in order to achieve the optimal gate conductor work function given the conductivity type of the FET 200, 400, 400'. The RMG 225, 425 can further include conductive fill material on the work function metal layer. A dielectric gate cap 226, 426 (e.g., a silicon nitride gate cap) can be above the top surface of the conductive fill material.

It should be noted that, since various RMG structures and the methods of making them are well known in the art and could be incorporated into FETs 200, 400 and 400', only the RMG 225, as a whole, is illustrated in the FIGS. 12A-12C and only the RMG 425, as a whole, is illustrated in FIGS. 28A-28C and FIGS. 29A-29C. The individual components of the RMGs 225 and 425, including any additional dielectric sidewall spacers, the the gate dielectric layer, the work function metal layer, the conductive fill material, etc., are not specifically illustrated in the figures in order to allow the reader to focus on the salient aspects of the disclosed structures.

Additionally, each FET 200, 400, 400' can include layers of oxide material 242, 442 (e.g., layers of silicon germanium oxide), which electrically isolate and physically separate the source/drain regions 213, 413 from the semiconductor layer 202, 402 below. Thus, these layers of oxide material 242, 442 function as local isolation layers that minimize and preferably prevent through-substrate and, particularly, subchannel region source-to-drain leakage. These layers of oxide material 242, 442 can be immediately adjacent to the top surface of the semiconductor layer 202, 402 (e.g., see the partially completed structures shown in FIGS. 8A-8C and 20A-20C) and the source/drain regions 213, 413 can, in their entirety, be above the top surface of the semiconductor layer 202, 402. Alternatively, as illustrated in FIGS. 12A-12C, 28A-28C, and 29A-29C, the semiconductor layer 202, 402 can have a top surface and source/drain recesses in the top surface on opposing sides of the RMG 225, 425. In this case, the layers of oxide material 242, 442 can line the vertical and horizontal surfaces of the semiconductor layer 202, 402 within the source/drain recesses and the source/drain regions 213, 413 can be on the oxide material 242, 442 filling the remaining portions of the recesses and further extending vertically above the top surface of the semiconductor layer 202, 402.

It should be noted that, due to the processing techniques described above and used to form the NWFET structure 400, additional layers of the oxide material 442 can be contained within the source/drain regions 413 and vertically oriented on the sides closest to the RMG 425. These additional layers of the oxide material 442 can further be aligned vertically, physically separated from each other and positioned laterally between the source/drain regions 413 and those portions of the RMG 425 that are stacked above and/or below the nanowire channel region(s) 411a-c. Thus, these additional layers of the oxide material 442 can provide additional isolation between the RMG 425 and the source/drain regions 413.

In the NWFET structure 400', such additional layers of oxide material are removed during processing to ensure that the nanowire channel regions 411'a-b are electrically connected to the source/drain regions 413.

In the methods and structures described above the non-planar FET (e.g., the FINFET 200 of FIGS. 12A-12C, the NWFET 400 of FIGS. 28A-28C and the NWFET 400' of FIGS. 29A-29C) can be an N-type FET or a P-type FET. As discussed above, for an N-type FET, the channel region can have P-type conductivity (or can be undoped) and the source/drain regions can have N-type conductivity; whereas, for a P-type FET, the channel region can have N-type conductivity (or can be undoped) and the source/drain regions can have P-type conductivity. Those skilled in the art will recognize that different dopants can be used to achieve the different conductivity types and that the dopants may vary depending upon the different semiconductor materials used. For example, a silicon-based semiconductor material (e.g., silicon, silicon germanium, etc.) having N-type conductivity is typically doped with an N-type dopant (e.g., a Group V dopant, such as arsenic (As), phosphorous (P) or antimony (Sb)), whereas a silicon-based semiconductor material having P-type conductivity is typically doped with a P-type dopant (e.g., a Group III dopant, such as boron (B) or indium (In)). Alternatively, a gallium nitride (GaN)-based semiconductor material having P-type conductivity is typically doped with magnesium (Mg), whereas a gallium nitride (GaN)-based semiconductor material having N-type conductivity is typically doped with silicon (Si). Those skilled in the art will also recognize that different conductivity levels will depend upon the relative concentration levels of the dopants.

Additionally, in the methods and structures described above the non-planar FET includes a RMG with a dielectric gate cap (e.g., see RMG 225 of FIGS. 12A-12C and RMG 425 of FIGS. 28A-28C and FIGS. 29A-29C). In such a RMG, the additional dielectric sidewall spacers can be silicon nitride sidewall spacers, silicon oxynitride sidewall spacers, etc. The gate dielectric layer can be a silicon dioxide gate dielectric layer. Alternatively and preferably, the gate dielectric layer can be a high-K gate dielectric layer. The high-K gate dielectric layer can be, for example, a dielectric material with a dielectric constant that is greater than the dielectric constant of silicon dioxide (i.e., greater than 3.9). Exemplary high-K dielectric materials include, but are not limited to, hafnium (Hf)-based dielectrics (e.g., hafnium oxide, hafnium silicon oxide, hafnium silicon oxynitride, hafnium aluminum oxide, etc.) or other suitable high-k dielectrics (e.g., aluminum oxide, tantalum oxide, zirconium oxide, etc.). The work function metal of the RMG can include a metal material or metal alloy material that is preselected in order to achieve the optimal gate conductor work function given the conductivity type of the FET. For example, the optimal gate conductor work function of an NFET will be, for example, between 3.9 eV and about 4.2 eV. Exemplary metals (and metal alloys) having a work function within this range include, but are not limited to, hafnium, zirconium, titanium, tantalum, aluminum, and alloys thereof, such as, hafnium carbide, zirconium carbide, titanium carbide, tantalum carbide, and aluminum carbide. The optimal gate conductor work function for a PFET will be, for example, between about 4.9 eV and about 5.2 eV. Exemplary metals (and metal alloys) having a work function within this range include, but are not limited to, ruthenium, palladium, platinum, cobalt, and nickel, as well as metal oxides (aluminum carbon oxide, aluminum titanium carbon oxide, etc.) and metal nitrides (e.g., titanium nitride, titanium silicon nitride, tantalum silicon nitride, titanium aluminum nitride, tantalum aluminum nitride, etc.). The conductive fill material of the RMG can be a blanket layer of a metal or a metal alloy, such as tungsten, a tungsten alloy (e.g., tungsten silicide or titanium tungsten), cobalt, aluminum or any other suitable metal or metal alloy.

It should be understood that the terminology used herein is for the purpose of describing the disclosed structures and methods and is not intended to be limiting. For example, as used herein, the singular forms "a", "an" and "the" are intended to include the plural forms as well, unless the context clearly indicates otherwise. Additionally, as used herein, the terms "comprises" "comprising", "includes" and/or "including" specify the presence of stated features, integers, steps, operations, elements, and/or components, but do not preclude the presence or addition of one or more other features, integers, steps, operations, elements, components, and/or groups thereof. Furthermore, as used herein, terms such as "right", "left", "vertical", "horizontal", "top", "bottom", "upper", "lower", "under", "below", "underlying", "over", "overlying", "parallel", "perpendicular", etc., are intended to describe relative locations as they are oriented and illustrated in the drawings (unless otherwise indicated) and terms such as "touching", "in direct contact", "abutting", "directly adjacent to", "immediately adjacent to", etc., are intended to indicate that at least one element physically contacts another element (without other elements separating the described elements). The term "laterally" is used herein to describe the relative locations of elements and, more particularly, to indicate that an element is positioned to the side of another element as opposed to above or below the other element, as those elements are oriented and illustrated in the drawings. For example, an element that is positioned laterally adjacent to another element will be beside the other element, an element that is positioned laterally immediately adjacent to another element will be directly beside the other element, and an element that laterally surrounds another element will be adjacent to and border the outer sidewalls of the other element. The corresponding structures, materials, acts, and equivalents of all means or step plus function elements in the claims below are intended to include any structure, material, or act for performing the function in combination with other claimed elements as specifically claimed.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A semiconductor structure comprising:
   a semiconductor layer on a substrate;
   a non-planar field effect transistor on the semiconductor layer and comprising:
      source/drain regions;
      at least one channel region positioned laterally between the source/drain regions; and
      a gate structure adjacent to the channel region; and
   layers of oxide material electrically isolating and physically separating the source/drain regions from the semiconductor layer,
   each layer of oxide material having a bottom surface immediately adjacent to the semiconductor layer and a top surface immediately adjacent to a source/drain region,
   the channel region comprising any one of a first semiconductor material and a second semiconductor material that is different from the first semiconductor material,
   the semiconductor layer comprising the second semiconductor material, and
   the oxide material comprises an oxide of the second semiconductor material.

2. The semiconductor structure of claim 1, wherein the layers of oxide material reduce source-to-drain leakage below the channel region.

3. The semiconductor structure of claim 1,
   the substrate comprising the first semiconductor material,
   the first semiconductor material comprising silicon, the second semiconductor material comprising silicon germanium, and
the layers of oxide material comprising layers of silicon germanium oxide.

4. The semiconductor structure of claim 1,
the non-planar field effect transistor is a fin-type field effect transistor,
the channel region is a single fin-shaped channel region comprising the first semiconductor material immediately adjacent to a top surface of the semiconductor layer, and
the gate structure is adjacent to opposing sides of the single fin-shaped channel region.

5. The semiconductor structure of claim 1,
the non-planar field effect transistor is a nanowire-type field effect transistor,
the at least one channel region comprising at least one nanowire physically separated from a top surface of the semiconductor layer, and
the gate structure wrapping around the at least one nanowire.

6. The semiconductor structure of claim 1, the layers of oxide material being on a horizontal surface of the semiconductor layer.

7. The semiconductor structure of claim 1, the semiconductor layer having a top surface and recesses in the top surface on opposing sides of the gate structure, the layers of oxide material being on vertical and horizontal surfaces of the semiconductor layer within the recesses and the source/drain regions being on the layers of oxide material and extending vertically above the top surface of the semiconductor layer.

8. A semiconductor structure comprising:
a semiconductor layer on a substrate;
a non-planar field effect transistor on the semiconductor layer and comprising:
source/drain regions;
at least one channel region positioned laterally between the source/drain regions; and
a gate structure adjacent to the channel region; and
layers of oxide material electrically isolating and physically separating the source/drain regions from the semiconductor layer,
each layer of oxide material having a bottom surface immediately adjacent to the semiconductor layer and a top surface immediately adjacent to a source/drain region,
the source/drain regions being aligned above the layers of oxide material, respectively, and the source/drain regions and the layers of oxide materials having essentially equal lengths as measured from an inner end adjacent to the channel region to an outer end opposite the inner end,
the channel region comprising any one of a first semiconductor material and a second semiconductor material that is different from the first semiconductor material,
the semiconductor layer comprising the second semiconductor material, and
the oxide material comprises an oxide of the second semiconductor material.

9. The semiconductor structure of claim 8, wherein the layers of oxide material reduce source-to-drain leakage below the channel region.

10. The semiconductor structure of claim 8,
the substrate comprising the first semiconductor material,
the first semiconductor material comprising silicon,
the second semiconductor material comprising silicon germanium, and
the layers of oxide material comprising layers of silicon germanium oxide.

11. The semiconductor structure of claim 8,
the non-planar field effect transistor is a fin-type field effect transistor,
the channel region is a single fin-shaped channel region comprising the first semiconductor material immediately adjacent to a top surface of the semiconductor layer, and
the gate structure is adjacent to opposing sides of the single fin-shaped channel region.

12. The semiconductor structure of claim 8, the layers of oxide material being on a horizontal surface of the semiconductor layer.

13. The semiconductor structure of claim 8, the semiconductor layer having a top surface and recesses in the top surface on opposing sides of the gate structure, the layers of oxide material being on vertical and horizontal surfaces of the semiconductor layer within the recesses and the source/drain regions being on the layers of oxide material and extending vertically above the top surface of the semiconductor layer.

14. A semiconductor structure comprising:
a silicon germanium layer on a silicon substrate;
a non-planar field effect transistor on the silicon germanium layer and comprising:
epitaxial silicon source/drain regions;
a silicon channel region positioned laterally between the epitaxial silicon source/drain regions; and
a gate structure adjacent to the silicon channel region; and
layers of silicon germanium oxide electrically isolating and physically separating the epitaxial silicon source/drain regions from the silicon germanium layer,
each layer of silicon germanium oxide having a bottom surface immediately adjacent to the silicon germanium layer and a top surface immediately adjacent to an epitaxial silicon source/drain region,
the epitaxial silicon source/drain regions being aligned above the layers of silicon germanium oxide, respectively, and the epitaxial source/drain regions and the layers of silicon germanium oxide having essentially equal lengths as measured from an inner end adjacent to the silicon channel region to an outer end opposite the inner end.

15. The semiconductor structure of claim 14, wherein the layers of silicon germanium oxide reduce source-to-drain leakage below the silicon channel region.

16. The semiconductor structure of claim 14,
the non-planar field effect transistor is a fin-type field effect transistor,
the silicon channel region is a single fin-shaped silicon channel region immediately adjacent to the top surface of the silicon germanium layer, and
the gate structure is adjacent to opposing sides of the single fin-shaped silicon channel region.

17. The semiconductor structure of claim 14, the layers of silicon germanium oxide being on a horizontal surface of the silicon germanium layer.

18. The semiconductor structure of claim 14, the silicon germanium layer having recesses in the top surface on opposing sides of the gate structure, the layers of silicon germanium oxide being on vertical and horizontal surfaces of the silicon germanium layer within the recesses and the epitaxial silicon source/drain regions being on the layers of silicon germanium oxide.

* * * * *